United States Patent
Rui et al.

(10) Patent No.: US 9,178,006 B2
(45) Date of Patent: Nov. 3, 2015

(54) METHODS TO IMPROVE ELECTRICAL PERFORMANCE OF ZRO2 BASED HIGH-K DIELECTRIC MATERIALS FOR DRAM APPLICATIONS

(71) Applicants: Intermolecular, Inc., San Jose, CA (US); Elpida Memory, Inc., Tokyo (JP)

(72) Inventors: Xiangxin Rui, Campbell, CA (US); Hanhong Chen, Milpitas, CA (US); Naonori Fujiwara, Kure (JP); Imran Hashim, Saratoga, CA (US); Kenichi Koyanagi, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 14/177,118

(22) Filed: Feb. 10, 2014

(65) Prior Publication Data
US 2015/0228710 A1 Aug. 13, 2015

(51) Int. Cl.
  *H01L 49/02* (2006.01)
  *H01L 27/108* (2006.01)
  *H01G 4/10* (2006.01)

(52) U.S. Cl.
  CPC ............ *H01L 28/40* (2013.01); *H01L 27/1085* (2013.01); *H01L 28/56* (2013.01); *H01G 4/10* (2013.01)

(58) Field of Classification Search
  CPC .......... H01L 28/56; H01L 28/40; H01G 4/10; H01G 4/1218; H01G 4/1227
  See application file for complete search history.

(56) References Cited

U.S. PATENT DOCUMENTS

| | | | |
|---|---|---|---|
| 5,185,689 A * | 2/1993 | Maniar | 361/313 |
| 6,660,660 B2 * | 12/2003 | Haukka et al. | 438/778 |
| 6,841,439 B1 * | 1/2005 | Anthony et al. | 438/216 |
| 7,723,771 B2 | 5/2010 | Boescke et al. | |
| 7,772,132 B2 | 8/2010 | Kil et al. | |
| 8,415,227 B2 | 4/2013 | Malhotra et al. | |
| 2006/0097305 A1 | 5/2006 | Lee | |
| 2013/0071987 A1 | 3/2013 | Chen | |

FOREIGN PATENT DOCUMENTS

WO  2012005957A3 A3  1/2012

* cited by examiner

*Primary Examiner* — Allen Parker

(57) ABSTRACT

A method for reducing the leakage current in DRAM MIM capacitors comprises forming a multi-layer dielectric stack from an amorphous highly doped material, an amorphous high band gap material, and a lightly-doped or non-doped material. The highly doped material will remain amorphous (<30% crystalline) after an anneal step. The high band gap material will remain amorphous (<30% crystalline) after an anneal step. The lightly-doped or non-doped material will become crystalline (≥30% crystalline) after an anneal step. The high band gap material is formed between the amorphous highly doped material and the lightly or non-doped material and provides an intermediate barrier to conduction through the multi-layer dielectric stack.

16 Claims, 19 Drawing Sheets

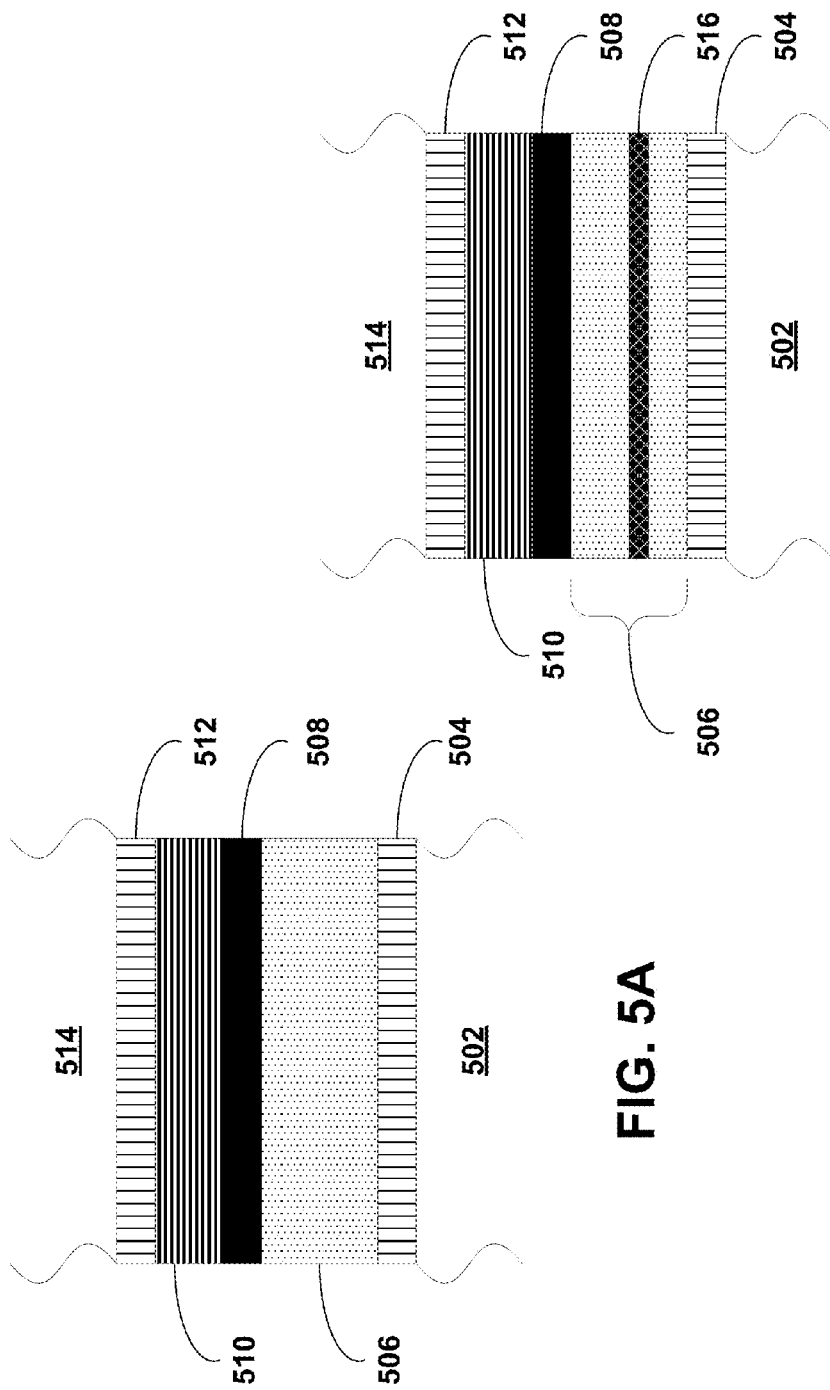

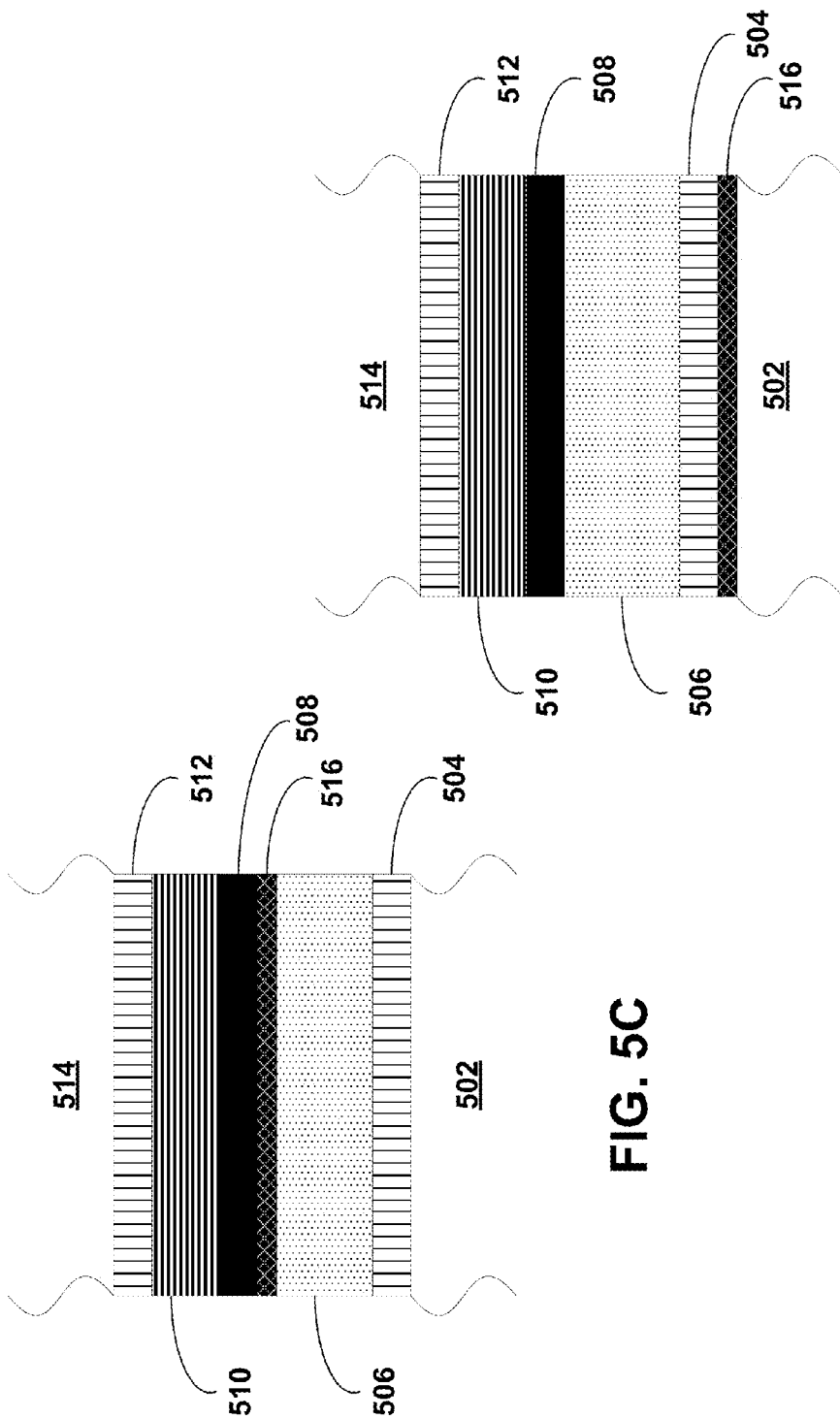

US 9,178,006 B2

METHODS TO IMPROVE ELECTRICAL PERFORMANCE OF ZRO2 BASED HIGH-K DIELECTRIC MATERIALS FOR DRAM APPLICATIONS

This document relates to the subject matter of a joint research agreement between Intermolecular, Inc. and Elpida Memory, Inc.

FIELD OF THE INVENTION

The present invention relates generally to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increase as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

There is a need to develop processes that allow the formation of a dielectric layer that exhibits lower leakage current, a high EOT, and a high k-value.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a multi-layer dielectric stack is formed from a highly doped material, a high band gap material, and a lightly- or non-doped material. The highly doped material will remain amorphous (<30% crystalline) after an anneal step. The high band gap material will remain amorphous (<30% crystalline) after an anneal step. The lightly- or non-doped material will become crystalline (≥30% crystalline) after an anneal step. In some embodiments, the multi-layer dielectric stack is formed from ZrO$_2$. In some embodiments, the lightly- or non-doped ZrO$_2$ material is formed above a first electrode layer, the high band gap material is formed above the lightly- or non-doped ZrO$_2$ material, and the highly doped ZrO$_2$ material is formed above the high band gap material. In some embodiments, the highly doped ZrO$_2$ material is formed from a nanolaminate of ZrO$_2$ and SiO$_2$. In some embodiments, a thin SiO$_2$ layer is formed between the first electrode layer and the lightly- or non-doped $ZrO_2$ material. In some embodiments, a thin $SiO_2$ layer is formed between the second electrode layer and the highly doped $ZrO_2$ material. In some embodiments, a thin $SiO_2$ layer is formed within the lightly- or non-doped $ZrO_2$ material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 5A-5D illustrate simplified cross-sectional views of semiconductor layer stacks fabricated in accordance with some embodiments.

DETAILED DESCRIPTION

Figure 1:
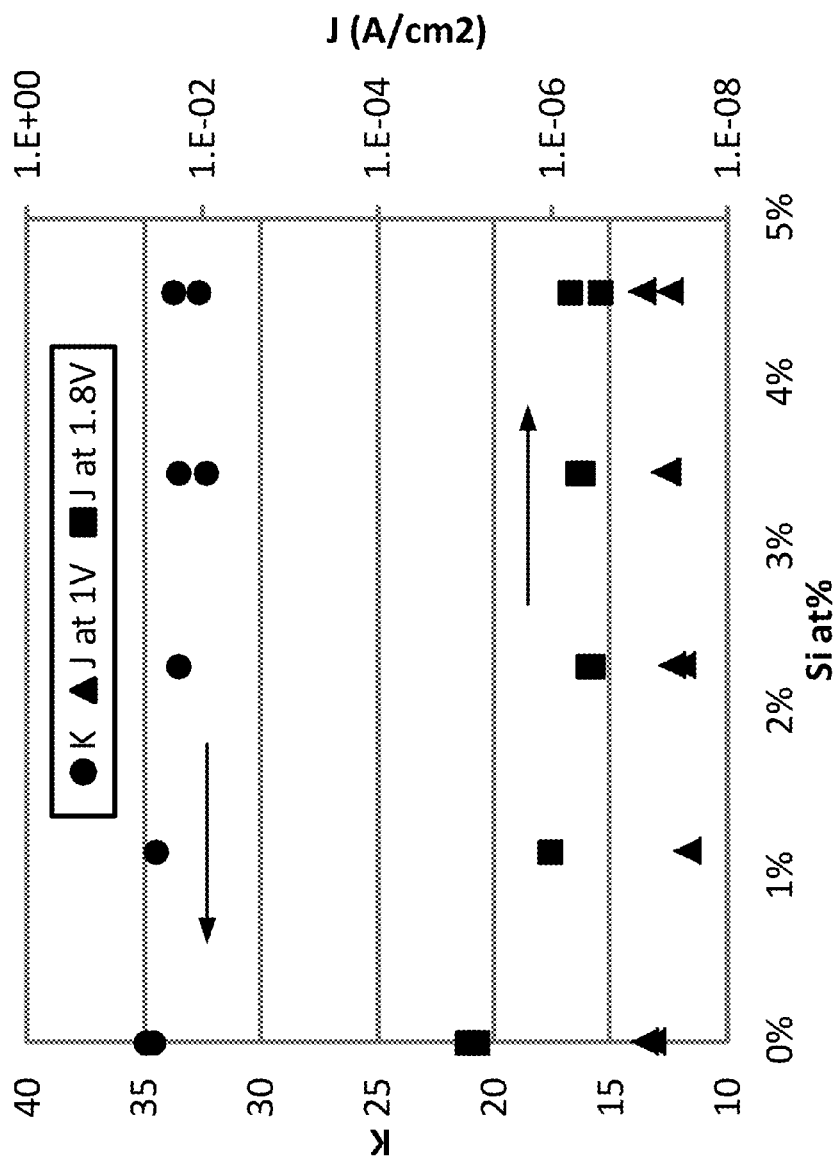
FIG. 1 presents data for K and J versus Si atomic % in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" may also include two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

The discussion herein will use a simple capacitor stack as an illustration. The capacitor stack will include a first electrode layer (sometimes called a bottom electrode layer), a dielectric layer, and a second electrode layer (sometimes called a top electrode layer). Those skilled in the art will understand that each of the first electrode layer, dielectric layer, and second electrode layer may include multiple layers and multiple materials. In some embodiments, an additional layer will be inserted between the first electrode layer and the dielectric layer. As used herein, this layer will be labeled a "flash" layer. In some embodiments, an additional layer will be inserted between the dielectric layer and the second electrode layer. As used herein, this layer will be labeled a "capping" layer. The terms "first", "bottom", "second", "top", "flash", "capping", etc. are included for convenience and to assist in the description of the capacitor stack and are not meant to be limiting.

As used herein, a material (e.g. a dielectric material or an electrode material) will be considered to be "crystalline" if it exhibits greater than or equal to 30% crystallinity as measured by a technique such as x-ray diffraction (XRD).

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the dielectric material comprise annealing time, annealing temperature, film thickness, etc. Generally, as the concentration of the dopant is increased, the crystallization temperature of the dielectric material increases.

The term "nanolaminate", as used herein, will be understood to be defined as a material or layer that is formed from the deposition of a plurality of sub-layers. Typically, the sub-layers include different materials and the different sub-layers are alternated in a predetermined ratio of thicknesses and/or compositions.

In FIGS. 5A-5D, 8A-8B, and 13-16, a capacitor stack is illustrated using a simple planar structure. Those skilled in the art will appreciate that the description and teachings herein can be readily applied to any simple or complex capacitor morphology. The drawings are for illustrative purposes only and do not limit the application of the present disclosure.

One class of high-k dielectric materials possessing the characteristics required for implementation in advanced DRAM capacitors includes high-k metal oxide materials. Metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. Titanium oxide and zirconium oxide are two metal oxide dielectric materials which display significant promise in terms of serving as high-k dielectric materials for implementation in DRAM capacitors.

Leakage current in dielectric materials can be due to mechanisms such as Schottky emission, Frenkel-Poole defects (e.g. oxygen vacancies ($V_{ox}$) or grain boundaries), or Fowler-Nordheim tunneling, and the like. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

Lightly- or non-doped dielectric materials, wherein the dopant concentration is low (e.g. less than 7 atomic %), will generally be crystalline after being annealed at a temperature between 400 C to 600 C, and will exhibit high k-values, but typically also exhibit higher leakage current. As used herein, a dielectric material will be considered to be crystalline if it exhibits greater than or equal to 30% crystallinity as measured by a technique such as x-ray diffraction (XRD) after an anneal step. The higher leakage current is partly due to leakage along the grain boundaries due to the Frenkel-Poole mechanism discussed earlier. Conversely, highly doped dielectric materials, wherein the dopant concentration is high (e.g. greater than 7 atomic %, inclusive), will generally be amorphous after being annealed at a temperature between 400 C to 600 C, and will exhibit lower k-values, but will also exhibit low leakage current. Typically, dielectric materials that are doped to dopant levels above about 7 to 20 atomic % will remain amorphous after the typical anneal steps used in the fabrication of DRAM devices. However, this will vary depending on the dielectric material, the dopant, and the details of the annealing step and is not intended to be limiting. The properties of these two types of dielectric materials may be combined to concurrently meet the EOT (a function of the k-value) and the leakage current targets for advanced DRAM technologies.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the DRAM capacitor. Metals, such as platinum, gold, ruthenium, and ruthenium oxide are examples of high work function electrode materials suitable for inhibiting device leakage in a DRAM capacitor having a high-k dielectric material. The noble metal systems, however, are prohibitively expensive when employed in a mass production context. Moreover, electrodes fabricated from noble metals often suffer from poor manufacturing qualities, such as surface roughness and poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

One approach that has been used to improve the leakage current performance and increase the breakdown voltage performance of dielectric layers has been to add a high band gap material to the dielectric layer as a dopant. As an example, aluminum (e.g. as aluminum oxide) can be added to zirconium oxide to improve the leakage current performance and increase the breakdown voltage performance when compared to undoped zirconium oxide. Aluminum oxide has a band gap in the range of about 7 to about 8.8 eV, depending on the details of the crystalline phase and processing parameters. The dopants are typically added to the dielectric material in a concentration ranging from 0 to about 20 atomic %. Those with skill in the art will understand that at the upper range (e.g. between about 15 and 20 atomic %) the zirconium oxide will typically be amorphous.

In some embodiments, silicon (e.g. as silicon dioxide) can be added to zirconium oxide to improve the leakage current performance and increase the breakdown voltage performance when compared to undoped zirconium oxide. Silicon dioxide has a band gap in the range of about 9 eV, depending on the details of the crystalline phase and processing parameters. FIG. 1 presents data for K (i.e. the dielectric constant) and J (i.e. the leakage current density (A/cm$^2$)) versus Si atomic % in accordance with some embodiments. For these data, the atomic % of the silicon was varied from 0 to about 5 atomic %. The trend in the K values as a function of Si atomic % (i.e. the data points indicated by the circles) of the Si-doped zirconium oxide dielectric material shows a decrease as the Si atomic % is increased. This is reasonable due to the relative K values of the zirconium oxide (K can be about 35) and the silicon dioxide (K is about 3.9). FIG. 1 also presents data for the leakage current density (J) at two voltages. The data for the leakage current density (J) at 1.0V are presented by the data points indicated by the triangles. The data for the leakage current density (J) at 1.8V are presented by the data points indicated by the squares. Typically, the leakage current for dielectric material used in DRAM capacitors is higher when measured at higher voltages. The trend in the leakage current density (when measured at either 1.0V or 1.8V) as a function of Si atomic % shows a decrease as the Si atomic % is increased. The trend is stronger for the data measured at 1.8V. As discussed previously, the higher band gap of the silicon dioxide is reducing the leakage current through the dielectric material. These data indicate that the addition of silicon (e.g. in the form of silicon dioxide) to zirconium oxide improves the leakage current performance when compared to undoped zirconium oxide.

Figure 2:
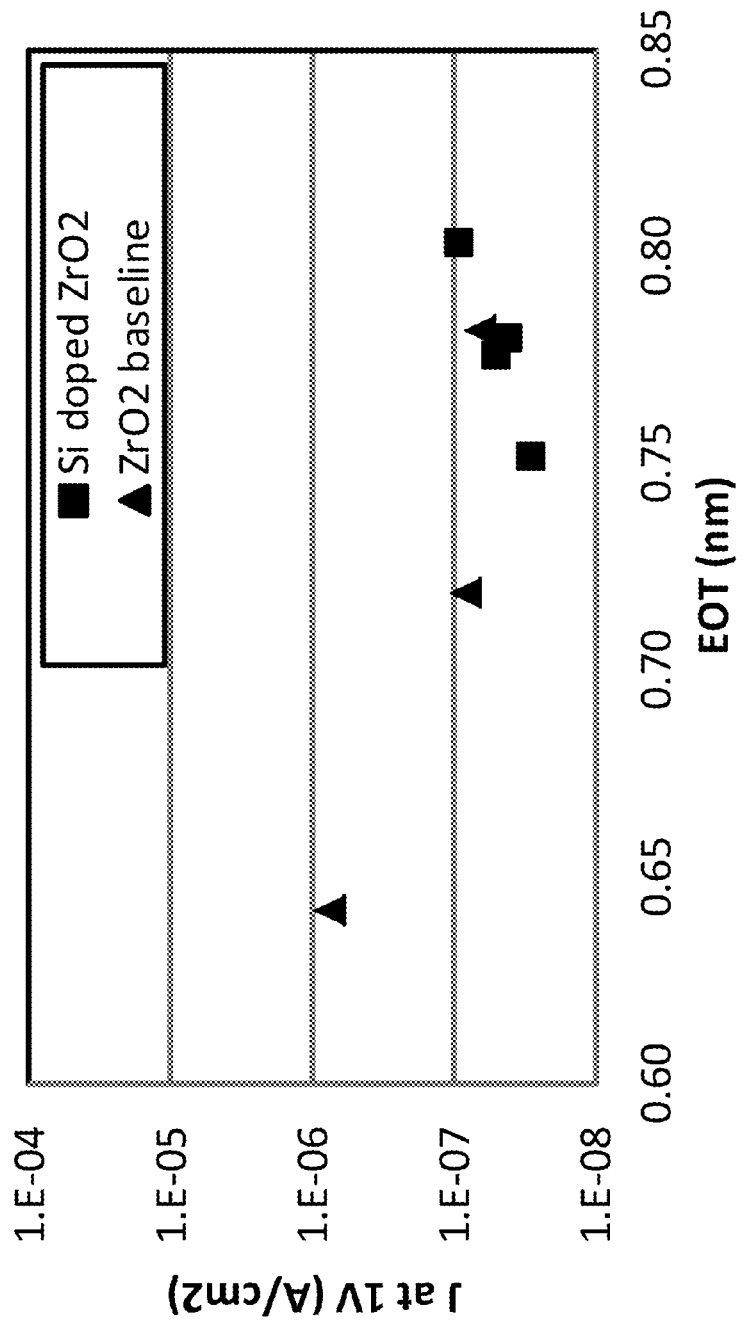
FIG. 2 presents data for J versus EOT in accordance with some embodiments.

FIG. 2 presents data for J versus EOT in accordance with some embodiments. The leakage current density data for the Si-doped zirconium oxide (indicated by the squares) are the same data presented in FIG. 1. As indicated in Eqn. 2, the EOT can be calculated from the measured capacitance value, electrode area, and the film thickness (d). Also illustrated in FIG. 2 are data for undoped zirconium oxide over a similar range of EOT values. The data in FIG. 2 indicate that the addition of silicon (e.g. in the form of silicon dioxide) to zirconium oxide improves the leakage current performance when compared to undoped zirconium oxide at similar values of EOT.

Figure 3:
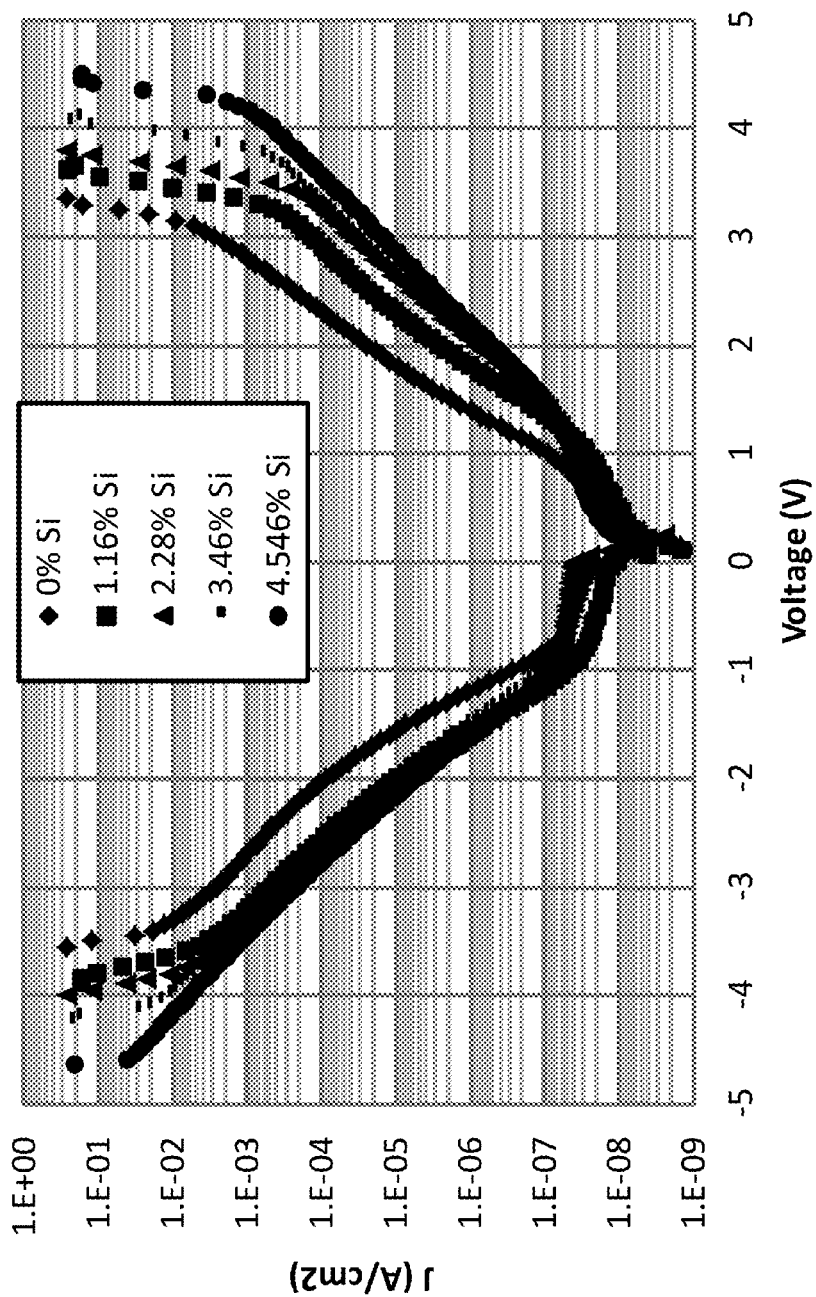
FIG. 3 presents data for J versus Voltage in accordance with some embodiments.

FIG. 3 presents data for J versus Voltage in accordance with some embodiments. For these data, the atomic % of the silicon was varied from 0 to about 5 atomic %. Five data sets are illustrated. Data from samples with no silicon doping (i.e. 0 atomic % Si) are illustrated using diamonds. Data from samples with 1.16 atomic % silicon doping are illustrated using squares. Data from samples with 2.28 atomic % silicon doping are illustrated using triangles. Data from samples with 3.46 atomic % silicon doping are illustrated using dashes. Data from samples with 4.54 atomic % silicon doping are illustrated using circles. These data indicate that, for films with same physical thickness, the leakage current density measured at a specific voltage tends to decrease as the amount of silicon doping is increased. These data also indicated that the breakdown voltage for the dielectric material increases as the amount of silicon doping is increased (e.g. the inflection point of the curves moves to higher voltages for samples with higher silicon doping concentration). The data in FIG. 3 indicate that the addition of silicon (e.g. in the form of silicon dioxide) to zirconium oxide improves the leakage current performance and increases the breakdown voltage when compared to undoped zirconium oxide.

FIGS. 4A-4D illustrate flow charts describing methods for fabricating semiconductor layer stacks in accordance with some embodiments. These semiconductor layer stacks could be implemented in the formation of DRAM capacitor stacks.

Figure 4A:
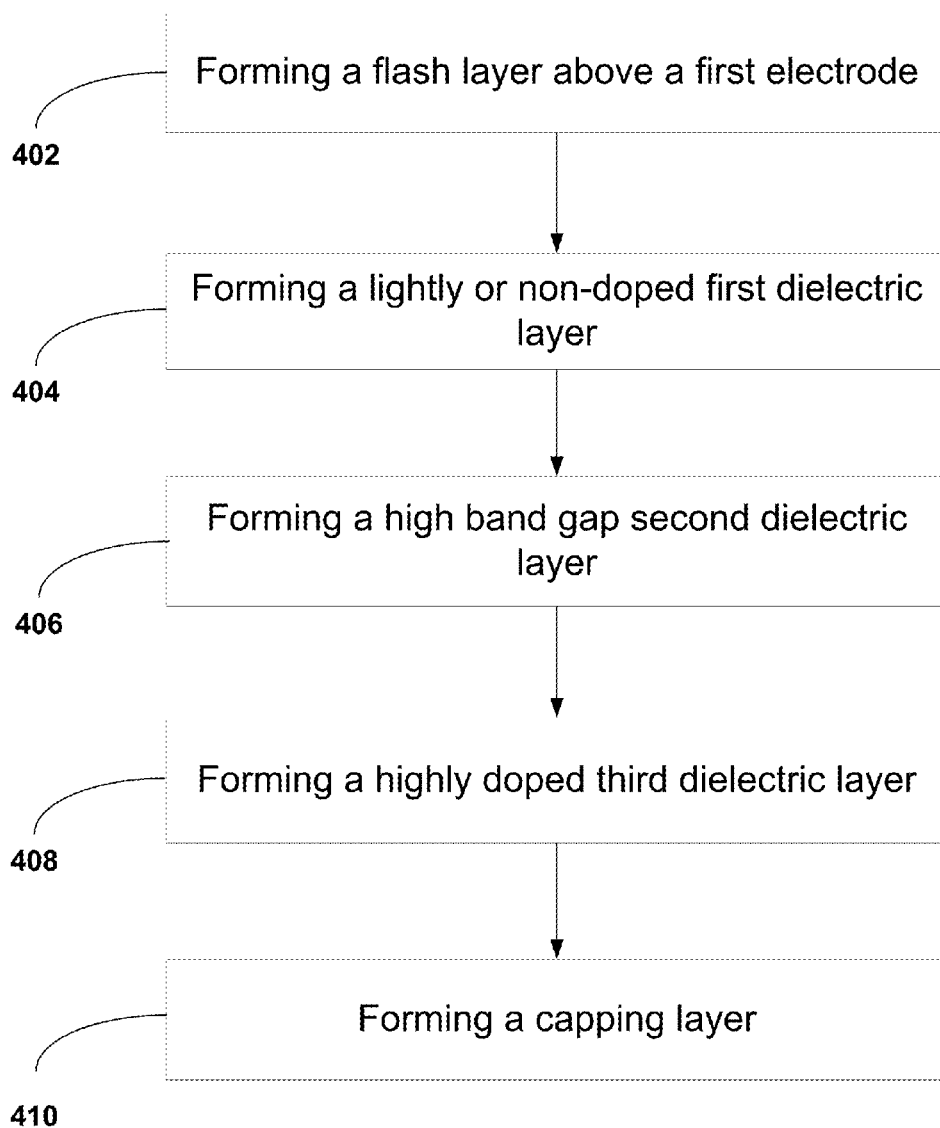
FIGS. 4A-4D illustrate flow charts describing method for fabricating DRAM capacitor stacks in accordance with some embodiments.

FIG. 4A describes a method, 400A, for fabricating a semiconductor layer stack. The initial step, 402, includes forming a flash layer above a first electrode layer formed above a substrate. Examples of suitable electrode materials include metals, metal alloys, conductive metal oxides, conductive metal silicides, conductive metal nitrides, or combinations thereof. Two particularly interesting classes of materials are the conductive metal oxides and the conductive metal nitrides. The purpose of the first electrode layer is to serve as a primary conductor. Examples of suitable materials for the first electrode layer include titanium nitride, titanium aluminum nitride, titanium silicon nitride, tantalum nitride, tantalum aluminum nitride, and tantalum silicon nitride or combinations thereof. Alternatively, the first electrode layer can be a conductive metal oxide. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is herein incorporated by reference for all purposes. Alternatively, if the first electrode is a conductive metal oxide, then the first electrode layer may be annealed in an inert or reducing atmosphere such as Ar, $N_2$, or forming gas. Examples of such an annealing process is further described in U.S. application Ser. No. 13/084,666 filed on Apr. 12, 2011, which is herein incorporated by reference for all purposes. In some embodiments, the flash layer includes a dielectric layer. Discussions of the use of flash layers within DRAM devices can be found in co-owned U.S. application Ser. No. 13/238,218, filed on Sep. 21, 2011, and co-owned U.S. application Ser. No. 13/731,452, filed on Dec. 31, 2012, each of which is herein incorporated by reference for all purposes. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

The next step, 404, includes forming a lightly- or non-doped first dielectric layer above the flash layer. This lightly- or non-doped first dielectric layer will crystallize during a subsequent thermal treatment and will contribute a high k value to the multi-layer dielectric stack. Suitable dopants for use with dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof.

The next step, 406, includes forming a high band gap second dielectric layer above the lightly- or non-doped first dielectric layer. This high band gap second dielectric layer will remain amorphous during a subsequent thermal treatment because it is thin and will contribute a high barrier to block conduction through the multi-layer dielectric stack.

The next step, 408, includes forming a highly doped third dielectric layer above the high band gap second dielectric layer to form a multi-layer dielectric stack. This highly doped third dielectric layer will remain amorphous during a subsequent thermal treatment because it is highly doped and will contribute a high barrier to block conduction through the multi-layer dielectric stack. The crystalline phases of dielectric materials exhibit higher-k values than the amorphous phases. Therefore, there is often an optional anneal step either after the dielectric formation step (also known as a post dielectric anneal (PDA)) or an anneal step after the formation of the second electrode (also known as a post metallization anneal (PMA)) to crystallize at least a portion of the dielectric layer. Examples of the PDA and PMA treatments are further described in U.S. application Ser. No. 13/159,842 filed on Jun. 14, 2011, which is herein incorporated by reference for all purposes.

The next step, 410, comprises forming a capping layer above the multi-layer dielectric stack. In some embodiments, the capping layer includes a dielectric layer. The use of capping layers within DRAM devices is described in co-owned U.S. application Ser. No. 13/290,795 filed on Nov. 7, 2011, which is herein incorporated by reference for all purposes. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Typically, a second electrode layer would be formed above the capping layer to form a capacitor stack (step not shown). Examples of suitable electrode materials comprise metals, metal alloys, conductive metal oxides, conductive metal silicides, conductive metal nitrides, or combinations thereof. Two particularly interesting classes of materials are the conductive metal oxides and the conductive metal nitrides. The purpose of the second electrode layer is to serve as a primary conductor. Examples of suitable materials for the second electrode layer include titanium nitride, titanium aluminum nitride, titanium silicon nitride, tantalum nitride, tantalum aluminum nitride, and tantalum silicon nitride or combinations thereof. Alternatively, the second electrode layer can be a conductive metal oxide. Typically, the capacitor stack can then be subjected to an annealing process (not shown) as discussed previously.

Those skilled in the art will appreciate that each of the flash layer, the first, second, and third dielectric materials, and the capping layer (as well as the two electrode layers) used in the semiconductor layer stack may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 4B:
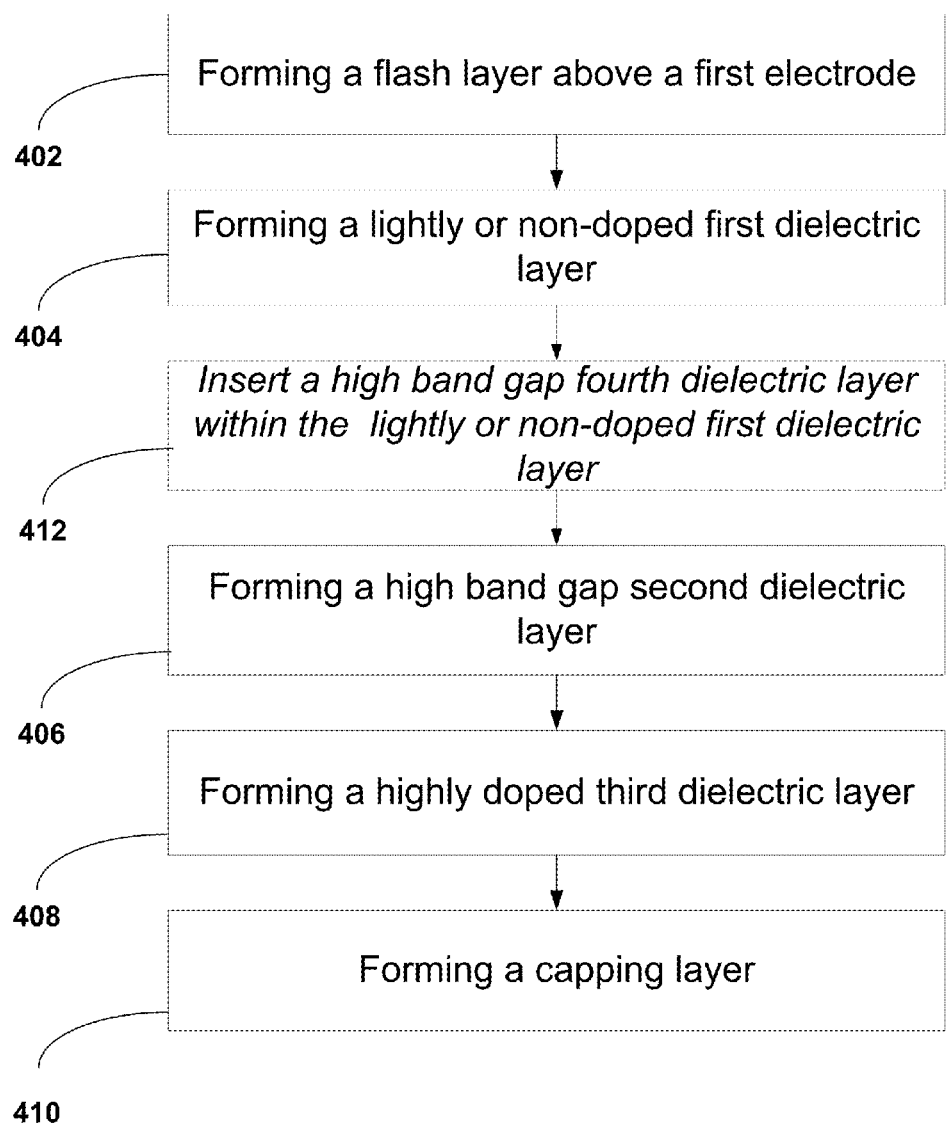

FIG. 4B describes a method, 400B, for fabricating a semiconductor layer stack. The initial step, 402, includes forming a flash layer above a first electrode layer formed above a substrate. Examples of suitable electrode materials include metals, metal alloys, conductive metal oxides, conductive metal silicides, conductive metal nitrides, or combinations thereof. Two particularly interesting classes of materials are the conductive metal oxides and the conductive metal nitrides. The purpose of the first electrode layer is to serve as a primary conductor. Examples of suitable first electrode materials and their treatments were described with respect to FIG. 4A. In some embodiments, the flash layer includes a dielectric layer. The use of flash layers within DRAM devices was discussed with respect to FIG. 4A. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

The next step, 404, includes forming a lightly- or non-doped first dielectric layer above the flash layer. This lightly- or non-doped first dielectric layer will crystallize during a subsequent thermal treatment and will contribute a high k value to the multi-layer dielectric stack. Suitable dopants for use with dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof.

The next step, 412, includes forming a high band gap fourth dielectric layer within the lightly- or non-doped first dielectric layer. This is accomplished by interrupting the formation of the lightly- or non-doped first dielectric layer process and forming the high band gap fourth dielectric layer over the partially-completed first dielectric layer. The forming of the lightly- or non-doped first dielectric layer is then continued to completion. In some embodiments, the high band gap fourth dielectric layer includes one of aluminum oxide or silicon oxide. The high band gap fourth dielectric layer may have a thickness between 0.5 Å and 10 Å.

The next step, 406, includes forming a high band gap second dielectric layer above the lightly- or non-doped first dielectric layer (which includes the high band gap fourth dielectric layer). This high band gap second dielectric layer will remain amorphous during a subsequent thermal treatment because it is thin and will contribute a high barrier to block conduction through the multi-layer dielectric stack.

The next step, 408, includes forming a highly doped third dielectric layer above the high band gap second dielectric layer to form a multi-layer dielectric stack. This highly doped third dielectric layer will remain amorphous during a subsequent thermal treatment because it is highly doped and will contribute a high barrier to block conduction through the multi-layer dielectric stack.

The next step, 410, comprises forming a capping layer above the multi-layer dielectric stack. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Typically, a second electrode layer would be formed above the capping layer to form a capacitor stack (step not shown). Examples of suitable second electrode materials and their treatments were described with respect to FIG. 4A. Typically, the capacitor stack can then be subjected to an annealing process (not shown) as discussed previously.

Figure 4C:
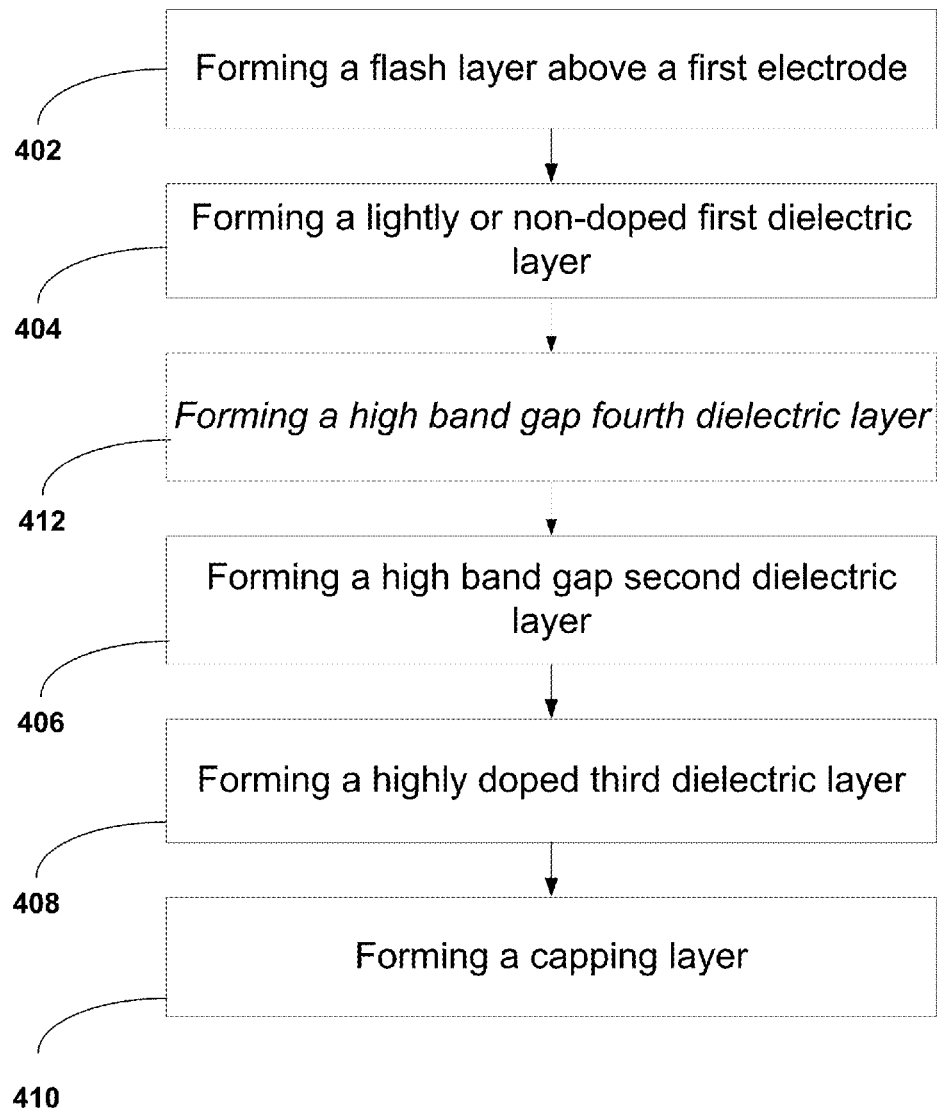

FIG. 4C describes a method, 400C, for fabricating a semiconductor layer stack. The initial step, 402, includes forming a flash layer above a first electrode layer formed above a substrate. Examples of suitable electrode materials include metals, metal alloys, conductive metal oxides, conductive metal silicides, conductive metal nitrides, or combinations thereof. Two particularly interesting classes of materials are the conductive metal oxides and the conductive metal nitrides. The purpose of the first electrode layer is to serve as a primary conductor. Examples of suitable first electrode materials and their treatments were described with respect to FIG. 4A. In some embodiments, the flash layer includes a dielectric layer. The use of flash layers within DRAM devices was discussed with respect to FIG. 4A. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

The next step, 404, includes forming a lightly- or non-doped first dielectric layer above the flash layer. This lightly- or non-doped first dielectric layer will crystallize during a subsequent thermal treatment and will contribute a high k value to the multi-layer dielectric stack. Suitable dopants for use with dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof.

The next step, 412, includes forming a high band gap fourth dielectric layer above the lightly- or non-doped first dielectric layer. This high band gap fourth dielectric layer will remain amorphous during a subsequent thermal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 1 Å and 10 Å.

The next step, 406, includes forming a high band gap second dielectric layer above the high band gap fourth dielectric layer. This high band gap second dielectric layer will remain amorphous during a subsequent thermal treatment because it is thin and will contribute a high barrier to block conduction through the multi-layer dielectric stack.

The next step, 408, includes forming a highly doped third dielectric layer above the high band gap second dielectric layer to form a multi-layer dielectric stack. This highly doped third dielectric layer will remain amorphous during a subsequent thermal treatment because it is highly doped and will contribute a high barrier to block conduction through the multi-layer dielectric stack.

The next step, 410, comprises forming a capping layer above the multi-layer dielectric stack. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Typically, a second electrode layer would be formed above the capping layer to form a capacitor stack (step not shown). Examples of suitable second electrode materials and their treatments were described with respect to FIG. 4A. Typically, the capacitor stack can then be subjected to an annealing process (not shown) as discussed previously.

Figure 4D:
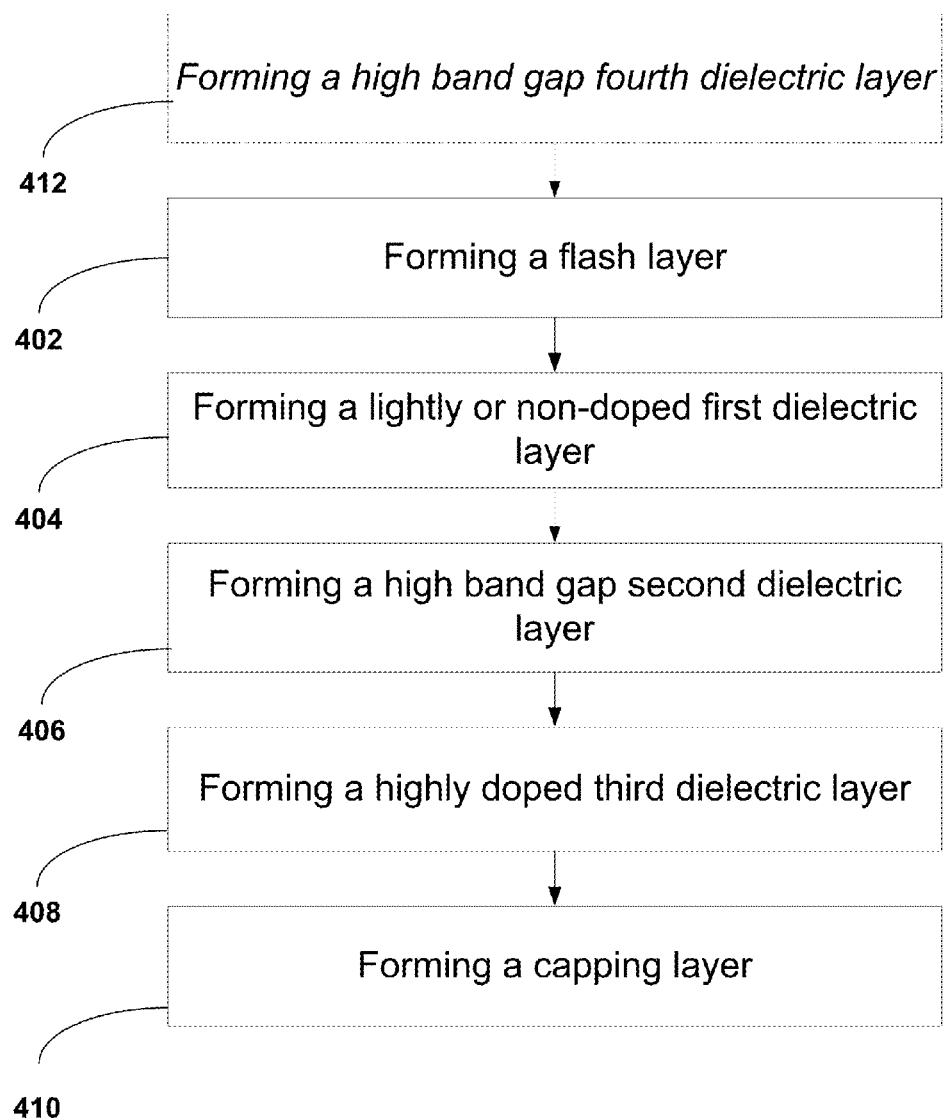

FIG. 4D describes a method, 400C, for fabricating a semiconductor layer stack. The initial step, 412, includes forming a high band gap fourth dielectric layer above a first electrode layer formed above a substrate. Examples of suitable electrode materials include metals, metal alloys, conductive metal oxides, conductive metal silicides, conductive metal nitrides, or combinations thereof. Two particularly interesting classes of materials are the conductive metal oxides and the conductive metal nitrides. The purpose of the first electrode layer is to serve as a primary conductor. Examples of suitable first electrode materials and their treatments were described with respect to FIG. 4A. This high band gap fourth dielectric layer will remain amorphous during a subsequent anneal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 0.5 Å and 10 Å.

The next step, 402, includes forming a flash layer above the high band gap fourth dielectric layer. In some embodiments, the flash layer includes a dielectric layer. The use of flash layers within DRAM devices was discussed with respect to FIG. 4A. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

The next step, 404, includes forming a lightly- or non-doped first dielectric layer above the flash layer. This lightly- or non-doped first dielectric layer will crystallize during a subsequent thermal treatment and will contribute a high k value to the multi-layer dielectric stack. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof.

The next step, 406, includes forming a high band gap second dielectric layer above the lightly- or non-doped first dielectric layer. This high band gap second dielectric layer will remain amorphous during a subsequent thermal treatment because it is thin and will contribute a high barrier to block conduction through the multi-layer dielectric stack.

The next step, 408, includes forming a highly doped third dielectric layer above the high band gap second dielectric layer to form a multi-layer dielectric stack. This highly doped third dielectric layer will remain amorphous during a subsequent thermal treatment because it is highly doped and will contribute a high barrier to block conduction through the multi-layer dielectric stack.

The next step, 410, comprises forming a capping layer above the multi-layer dielectric stack. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Typically, a second electrode layer would be formed above the capping layer to form a capacitor stack (step not shown). Examples of suitable second electrode materials and their treatments were described with respect to FIG. 4A. Typically, the capacitor stack can then be subjected to an annealing process (not shown) as discussed previously.

FIG. 5A illustrates a simplified cross-sectional view of a DRAM capacitor stack fabricated in accordance with some embodiments of the present invention. The formation of the capacitor stack illustrated in FIG. 5A will generally follow the method as outlined in FIG. 4A. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 502, is formed above a substrate (not shown). Generally, the substrate has already received several processing steps in the manufacture of a full DRAM device. First electrode layer, 502, includes one of metals, metal alloys, conductive metal oxides, conductive metal nitrides, conductive metal silicides, conductive metal carbides, etc. For this example, first electrode layer, 502, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 504, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 506, is then formed above the flash layer, 504. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly or non-doped zirconium oxide first dielectric layer will crystallize during a subsequent anneal step. This lightly- or non-doped zirconium oxide first dielectric layer will crystallize during a subsequent anneal treatment and will contribute a high k value to the multi-layer dielectric stack. The lightly- or non-doped zirconium oxide first dielectric layer is typically formed using ALD, PE-ALD, PECVD, or CVD.

High band gap second dielectric layer, 508, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent anneal treatment because it is thin and will contribute a high barrier to block conduction through the multi-layer dielectric stack. In some embodiments, the high band gap second dielectric layer includes aluminum oxide, or silicon oxide. The high band gap second dielectric layer is typically formed using ALD, PE-ALD, PECVD, or CVD. The high band gap second dielectric layer may have a thickness between 0.5 Å and 5 Å.

Highly-doped zirconium oxide third dielectric layer, 510, is then formed above the high band gap second dielectric layer, 508. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels between 7 atomic % to 20 atomic % so that the layer will not crystallize during a subsequent anneal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 512, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 514, is formed above the capping layer. Second electrode layer, 514, includes one of metals, metal alloys, conductive metal oxides, conductive metal nitrides, conductive metal silicides, conductive metal carbides, etc. For this example, second electrode layer, 514, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

FIG. 5B illustrates a simplified cross-sectional view of a DRAM capacitor stack fabricated in accordance with some embodiments of the present invention. The formation of the capacitor stack illustrated in FIG. 5B will generally follow the method as outlined in FIG. 4B. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 502, is formed above a substrate (not shown). Generally, the substrate has already received several processing steps in the manufacture of a full DRAM device. First electrode layer, 502, includes one of metals, metal alloys, conductive metal oxides, conductive metal nitrides, conductive metal silicides, conductive metal carbides, etc. For this example, first electrode layer, 502, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 504, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 506, is then formed above the flash layer, 504. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD.

During the formation of the lightly- or non-doped zirconium oxide first dielectric layer, 506, a high band gap fourth dielectric layer, 516, is inserted within the lightly- or non-doped zirconium oxide first dielectric layer. This is accomplished by interrupting the formation of the lightly- or non-doped first dielectric layer process and forming the high band gap fourth dielectric layer, 516. This layer will remain amorphous during a subsequent thermal treatment because it is thin and will contribute a high barrier to block conduction through the multi-layer dielectric stack. The high band gap fourth dielectric layer is typically formed using ALD, PE-ALD, PECVD, or CVD. The forming of the lightly- or non-doped first dielectric layer, 506, is then continued to completion. In some embodiments, the high band gap fourth dielectric layer includes one of aluminum oxide or silicon oxide. The high band gap fourth dielectric layer may have a thickness between 0.5 Å and 10 Å.

High band gap second dielectric layer, 508, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent anneal treatment because it is thin and will contribute a high barrier to block conduction through the multi-layer dielectric stack. In some embodiments, the high band gap second dielectric layer includes aluminum oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 510, is then formed above the high band gap second dielectric layer, 508. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent anneal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 512, is then formed above the Highly-doped zirconium oxide third dielectric layer. In some embodiments, the capping layer includes a dielectric layer. The capping layer is operable to reduce the leakage current through the capacitor stack. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 514, is formed above the capping layer. Second electrode layer, 514, includes one of metals, metal alloys, conductive metal oxides, conductive metal nitrides, conductive metal silicides, conductive metal carbides, etc. For this example, second electrode layer, 514, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

FIG. 5C illustrates a simplified cross-sectional view of a DRAM capacitor stack fabricated in accordance with some embodiments of the present invention. The formation of the capacitor stack illustrated in FIG. 5C will generally follow the method as outlined in FIG. 4C. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 502, is formed above a substrate (not shown). Generally, the substrate has already received several processing steps in the manufacture of a full DRAM device. First electrode layer, 502, includes one of metals, metal alloys, conductive metal oxides, conductive metal nitrides, conductive metal silicides, conductive metal carbides, etc. For this example, first electrode layer, 502, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 504, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 506, is then formed above the flash layer, 504. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent anneal treatment and will contribute a high k value to the multi-layer dielectric stack. The lightly- or non-doped zirconium oxide first dielectric layer is typically formed using ALD, PE-ALD, PECVD, or CVD.

High band gap fourth dielectric layer, 516, is then formed above the lightly- or non-doped zirconium oxide first dielectric layer, 506. This layer will remain amorphous during a subsequent thermal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 0.5 Å and 10 Å. The High band gap fourth dielectric layer is typically formed using ALD, PE-ALD, PECVD, or CVD.

High band gap second dielectric layer, 508, is then formed above the high band gap fourth dielectric layer, 516. Suitable high band gap second dielectric materials comprise at least one of aluminum oxide, erbium oxide, gadolinium oxide, lanthanum oxide, silicon oxide, or combinations thereof. This layer will remain amorphous during a subsequent anneal treatment because it is thin and will contribute a high barrier to block conduction through the multi-layer dielectric stack. In some embodiments, the high band gap second dielectric layer includes aluminum oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 510, is then formed above the high band gap second dielectric layer, 508. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent anneal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 512, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 514, is formed above the capping layer. Second electrode layer, 514, includes one of metals, metal alloys, conductive metal oxides, conductive metal nitrides, conductive metal silicides, conductive metal carbides, etc. For this example, second electrode layer, 514, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

FIG. 5D illustrates a simplified cross-sectional view of a DRAM capacitor stack fabricated in accordance with some embodiments of the present invention. The formation of the capacitor stack illustrated in FIG. 5D will generally follow the method as outlined in FIG. 4D. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 502, is formed above a substrate (not shown). Generally, the substrate has already received several processing steps in the manufacture of a full DRAM device. First electrode layer, 502, includes one of metals, metal alloys, conductive metal oxides, conductive metal nitrides, conductive metal silicides, conductive metal carbides, etc. For this example, first electrode layer, 502, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

High band gap fourth dielectric layer, 516, is then formed above the first electrode layer, 502. This layer will remain amorphous during a subsequent anneal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 0.5 Å and 10 Å. The high band gap fourth dielectric layer is typically formed using ALD, PE-ALD, PECVD, or CVD.

A flash layer, 504, is formed above the high band gap fourth dielectric layer, 516. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 506, is then formed above the flash layer, 504. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD.

High band gap second dielectric layer, 508, is then formed above the lightly- or non-doped zirconium oxide first dielectric layer, 506. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes aluminum oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 510, is then formed above the high band gap second dielectric layer, 508. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent anneal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 512, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 514, is formed above the capping layer. Second electrode layer, 514, includes one of metals, metal alloys, conductive metal oxides, conductive metal nitrides, conductive metal silicides, conductive metal carbides, etc. For this example, second electrode layer, 514, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

In these exemplary capacitor stacks, the lightly- or non-doped first dielectric layer has been described as being formed above the flash layer, the high band gap second dielectric layer has been described as being formed above the lightly- or non-doped first dielectric layer, and the highly doped third dielectric layer has been described as being formed above the high band gap second dielectric layer. Those skilled in the art will understand that the sequence may be altered and still achieve the benefits of the present disclosure. That is, the sequence may be that the highly doped third dielectric layer is formed above the flash layer, the high band gap second dielectric layer is formed above the highly doped third dielectric layer, and the lightly- or non-doped first dielectric layer is formed above the high band gap second dielectric. Both sequences fall within the scope of the present disclosure.

In this exemplary capacitor stack, the lightly- or non-doped dielectric material has been described as being the same material as the highly doped material. Those skilled in the art will understand that the two layers may comprise different materials and still achieve the benefits of the present invention. One of the layers (i.e. the lightly- or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly- or non-doped dielectric material. One of the layers (i.e. the lightly- or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Figure 6:
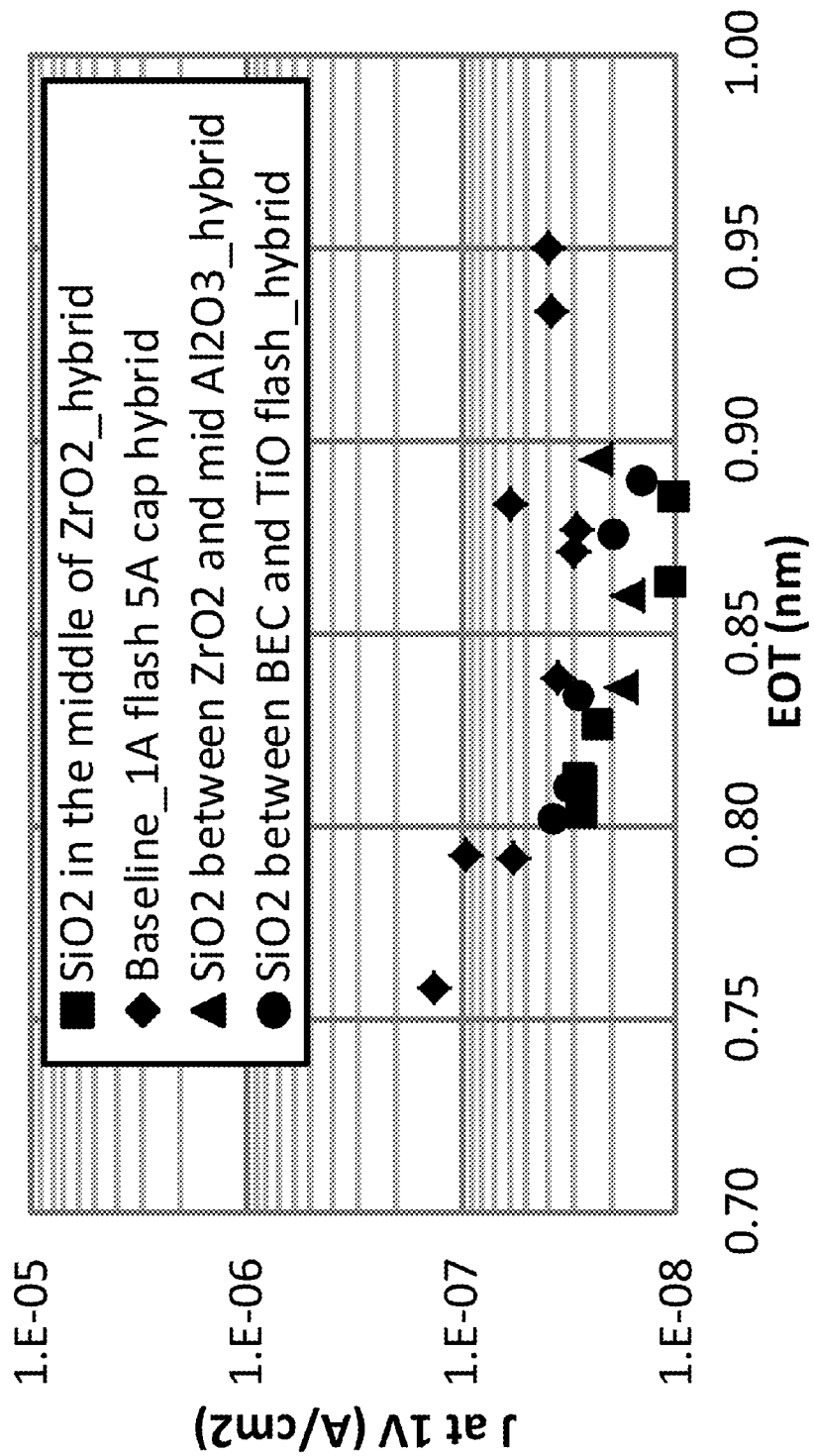
FIG. 6 presents data for J versus EOT in accordance with some embodiments.

FIG. 6 presents data for J versus EOT in accordance with some embodiments. As indicated in Eqn. 2, the EOT can be calculated from the measured capacitance, device surface area and the film thickness (d). The data correspond to capacitor stacks as discussed with respect to FIGS. 5A-5D. All of the capacitor stacks used titanium nitride first and second electrodes. The baseline data (illustrated with diamonds) correspond to a capacitor stack (from bottom to top) that includes a titanium oxide flash layer of 1 Å, an undoped zirconium oxide layer of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed within the undoped zirconium oxide layer (illustrated with squares) correspond to a capacitor stack (from bottom to top) that includes a titanium oxide flash layer of 1 Å, an undoped zirconium oxide layer (including the high band gap layer of silicon oxide) of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed between the undoped zirconium oxide layer and the aluminum oxide high band gap layer (illustrated with triangles) correspond to a capacitor stack (from bottom to top) that includes a titanium oxide flash layer of 1 Å, an undoped zirconium oxide layer of 40 to 55 Å, a silicon oxide high band gap layer of 1 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed between the first electrode layer and the titanium oxide flash layer (illustrated with circles) correspond to a capacitor stack (from bottom to top) that includes a silicon oxide high band gap layer of 1 Å, a titanium oxide flash layer of 1 Å, an undoped zirconium oxide layer of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data in FIG. 6 indicate that the addition of silicon (e.g. in the form of silicon dioxide) to zirconium oxide improves the leakage current performance when compared to undoped zirconium oxide at similar values of EOT. The data also indicate that the leakage current performance is improved for all three locations of the silicon oxide layer within the capacitor stack.

Figure 7:
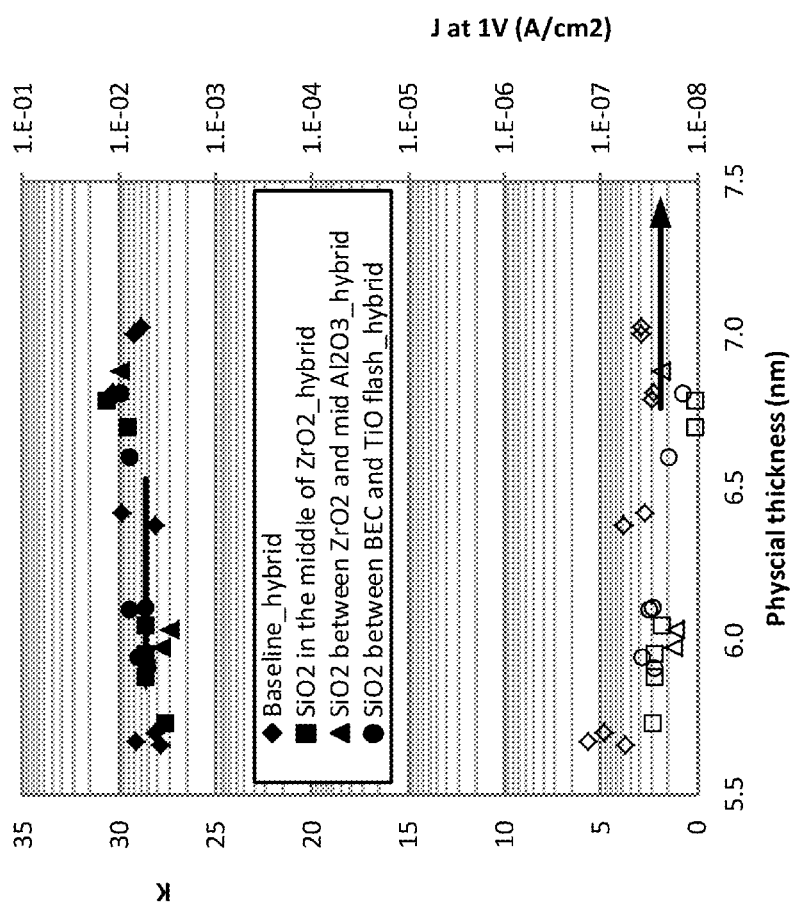
FIG. 7 presents data for K and J versus physical thickness in accordance with some embodiments.

FIG. 7 presents data for K and J versus physical thickness in accordance with some embodiments. The data correspond to capacitor stacks as discussed with respect to FIGS. 5A-5D. All of the capacitor stacks used titanium nitride first and second electrodes. In each case, the data corresponding to the k value are illustrated with solid symbols and the data corresponding to the leakage current density (J) are illustrated with open symbols. The baseline data (illustrated with diamonds) correspond to a capacitor stack (from bottom to top) that includes a titanium oxide flash layer of 1 Å, an undoped zirconium oxide layer of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed within the undoped zirconium oxide layer (illustrated with squares) correspond to a capacitor stack (from bottom to top) that includes a titanium oxide flash layer of 1 Å, an undoped zirconium oxide layer (including the high band gap layer of silicon oxide) of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed between the undoped zirconium oxide layer and the aluminum oxide high band gap layer (illustrated with triangles) correspond to a capacitor stack (from bottom to top) that includes a titanium oxide flash layer of 1 Å, an undoped zirconium oxide layer of 40 to 55 Å, a silicon oxide high band gap layer of 1 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed between the first electrode layer and the titanium oxide flash layer (illustrated with circles) correspond to a capacitor stack (from bottom to top) that includes a silicon oxide high band gap layer of 1 Å, a titanium oxide flash layer of 1 Å, an undoped zirconium oxide layer of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data in FIG. 7 indicate that the addition of silicon (e.g. in the form of silicon dioxide) to zirconium oxide improves the leakage current performance when compared to undoped zirconium oxide at similar values of physical thickness. The data also indicate that the leakage current performance is improved for all three locations of the silicon oxide layer within the capacitor stack.

Figure 8A:
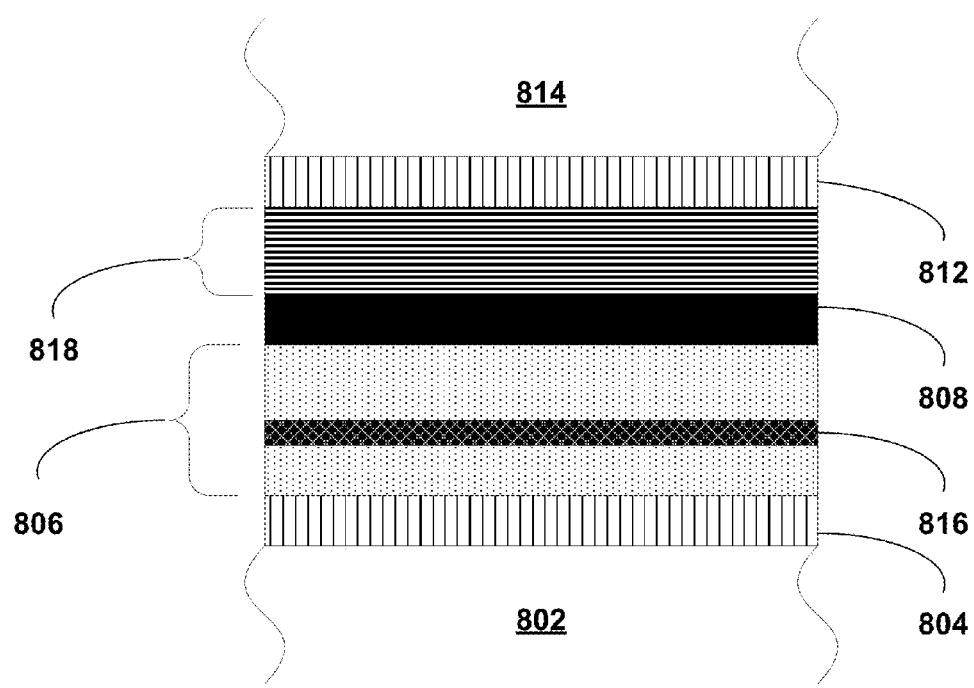
FIGS. 8A-8B illustrate simplified cross-sectional views of a DRAM memory stacks fabricated in accordance with some embodiments.
Figure 8B:
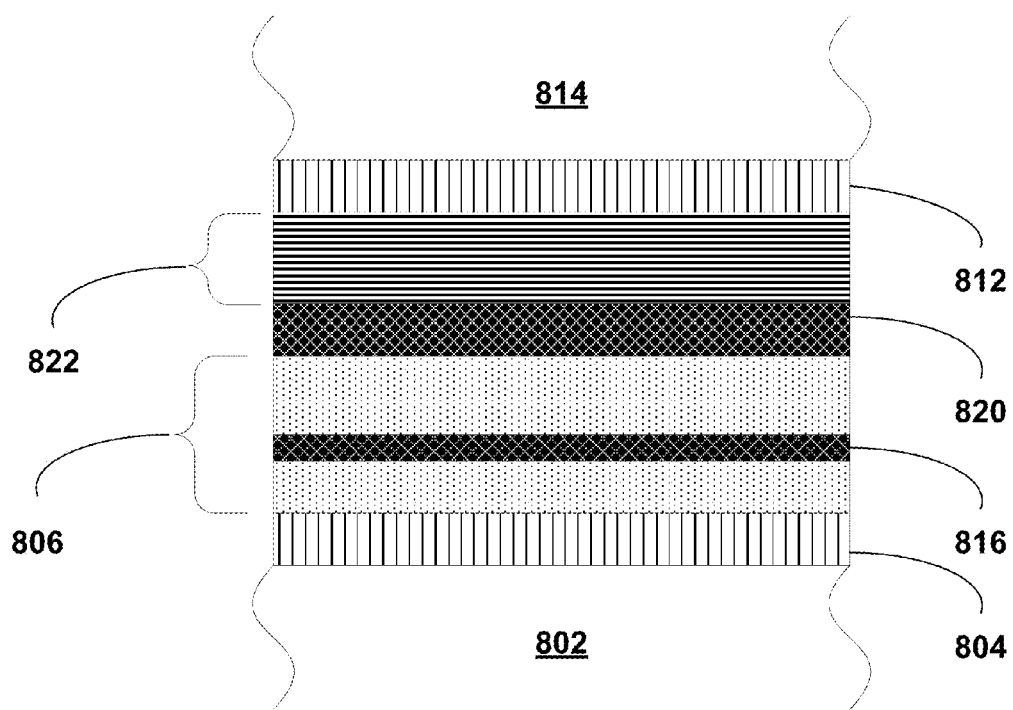

FIGS. 8A-8B illustrate simplified cross-sectional views of a DRAM memory stacks fabricated in accordance with some embodiments. FIG. 8A illustrates a simplified cross-sectional view of a DRAM capacitor stack fabricated in accordance with some embodiments of the present invention. The formation of the capacitor stack illustrated in FIG. 8A will generally follow the method as outlined in FIG. 4B. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 802, is formed above a substrate (not shown). Generally, the substrate has already received several processing steps in the manufacture of a full DRAM device. First electrode layer, 802, includes one of metals, metal alloys, conductive metal oxides, conductive metal nitrides, conductive metal silicides, conductive metal carbides, etc. For this example, first electrode layer, 802, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 804, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 806, is then formed above the flash layer, 804. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD.

During the formation of the lightly- or non-doped zirconium oxide first dielectric layer, 806, a high band gap fourth dielectric layer, 816, is inserted within the lightly- or non-doped zirconium oxide first dielectric layer. This is accomplished by interrupting the formation of the lightly- or non-doped first dielectric layer process and forming the high band gap fourth dielectric layer, 816. This layer will remain amorphous during a subsequent thermal treatment because it is thin and will contribute a high barrier to block conduction through the multi-layer dielectric stack. The high band gap fourth dielectric layer is typically formed using ALD, PE-ALD, PECVD, or CVD. The forming of the lightly- or non-doped first dielectric layer, 806, is then continued to completion. In some embodiments, the high band gap fourth dielectric layer includes one of aluminum oxide or silicon oxide. In some embodiments, the high band gap fourth dielectric layer includes silicon oxide. The high band gap fourth dielectric layer may have a thickness between 0.5 Å and 10 Å.

High band gap second dielectric layer, 808, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes aluminum oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 818, is then formed above the high band gap second dielectric layer, 808. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent thermal step. This highly-doped zirconium oxide third dielectric layer will contribute a high barrier to block conduction through the multi-layer dielectric stack. The highly-doped zirconium oxide third dielectric layer may be formed as a nanolaminate of zirconium oxide layers and dopant oxide layers. The ratio of the number of layers can be varied to determine the concentration of the dopant within the zirconium oxide. In some embodiments, aluminum oxide is used as the dopant oxide to form a nanolaminate of zirconium oxide and aluminum oxide. The multi-layer dielectric stack may optionally receive a PDA treatment as discussed previously. The highly-doped zirconium oxide third dielectric layer is typically formed using ALD, PE-ALD, PECVD, or CVD.

Capping layer, 812, is then formed above the highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 814, is formed above the capping layer. Second electrode layer, 814, includes one of metals, metal alloys, conductive metal oxides, conductive metal nitrides, conductive metal silicides, conductive metal carbides, etc. For this example, second electrode layer, 814, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

FIG. 8B illustrates a simplified cross-sectional view of a DRAM capacitor stack fabricated in accordance with some embodiments of the present invention. The formation of the capacitor stack illustrated in FIG. 8B will generally follow the method as outlined in FIG. 4B. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 802, is formed above a substrate (not shown). Generally, the substrate has already received several processing steps in the manufacture of a full DRAM device. First electrode layer, 802, includes one of metals, metal alloys, conductive metal oxides, conductive metal nitrides, conductive metal silicides, conductive metal carbides, etc. For this example, first electrode layer, 802, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 804, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 806, is then formed above the flash layer, 804. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent thermal step. This lightly- or non-doped zirconium oxide first dielectric layer will crystallize during a subsequent anneal treatment and will contribute a high k value to the multi-layer dielectric stack. The lightly- or non-doped zirconium oxide first dielectric layer is typically formed using ALD, PE-ALD, PECVD, or CVD.

During the formation of the lightly- or non-doped zirconium oxide first dielectric layer, 806, a high band gap fourth dielectric layer, 816, is inserted within the lightly- or non-doped zirconium oxide first dielectric layer. This is accomplished by interrupting the formation of the lightly- or non-doped first dielectric layer process and forming the high band gap fourth dielectric layer, 816. This layer will remain amorphous during a subsequent thermal treatment because it is thin and will contribute a high barrier to block conduction through the multi-layer dielectric stack. The high band gap fourth dielectric layer is typically formed using ALD, PE-ALD, PECVD, or CVD. The forming of the lightly- or non-doped first dielectric layer, 806, is then continued to completion. In some embodiments, the high band gap fourth dielectric layer includes one of aluminum oxide or silicon oxide. In some embodiments, the high band gap fourth dielectric layer includes silicon oxide. The high band gap fourth dielectric layer may have a thickness between 0.5 Å and 10 Å.

High band gap second dielectric layer, 820, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent anneal treatment because it is thin and will contribute a high barrier to block conduction through the multi-layer dielectric stack. In some embodiments, the high band gap second dielectric layer includes silicon oxide. The high band gap second dielectric layer is typically formed using ALD, PE-ALD, PECVD, or CVD. The high band gap second dielectric layer may have a thickness between 0.5 Å and 10 Å.

Highly-doped zirconium oxide third dielectric layer, 822, is then formed above the high band gap second dielectric layer, 820. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent thermal step. This highly-doped zirconium oxide third dielectric layer will contribute a high barrier to block conduction through the multi-layer dielectric stack. The highly-doped zirconium oxide third dielectric layer may be formed as a nanolaminate of zirconium oxide layers and dopant oxide layers. The ratio of the number of layers can be varied to determine the concentration of the dopant within the zirconium oxide. In some embodiments, silicon oxide is used as the dopant oxide to form a nanolaminate of zirconium oxide and silicon oxide. The multi-layer dielectric stack may optionally receive a PDA treatment as discussed previously. The highly-doped zirconium oxide third dielectric layer is typically formed using ALD, PE-ALD, PECVD, or CVD.

Capping layer, 812, is then formed above the highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 814, is formed above the capping layer. Second electrode layer, 814, includes one of metals, metal alloys, conductive metal oxides, conductive metal nitrides, conductive metal silicides, conductive metal carbides, etc. For this example, second electrode layer, 814, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

Figure 9:
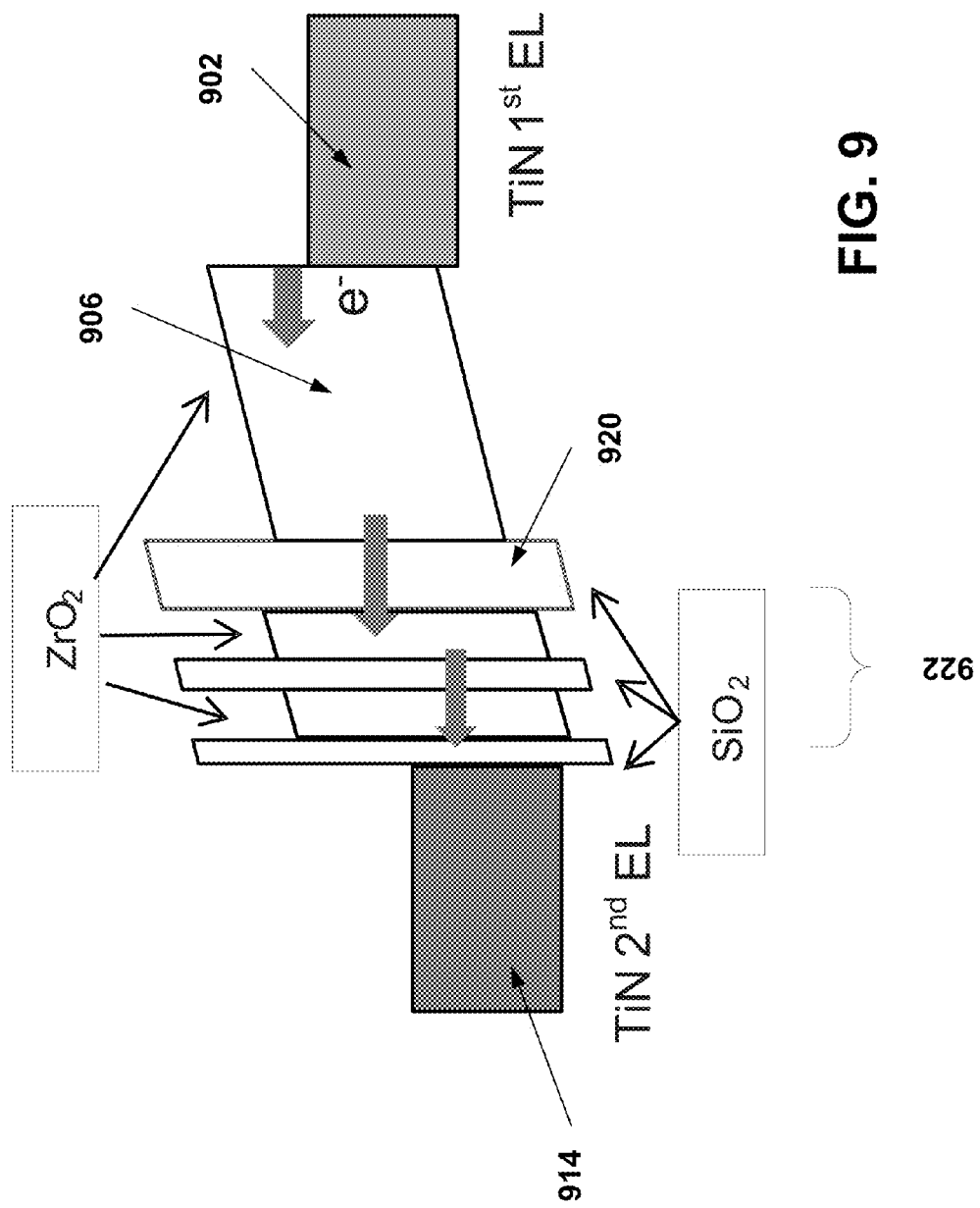
FIG. 9 illustrates a simplified band diagram of a DRAM capacitor stack accordance with some embodiments.

FIG. 9 illustrates a simplified band diagram of a DRAM capacitor stack accordance with some embodiments of the present invention. Those skilled in the art will understand that a similar band diagram could be illustrated for the any of the capacitor stacks described previously. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

First electrode layer, 902, is formed above a substrate (not shown). Generally, the substrate has already received several processing steps in the manufacture of a full DRAM device. First electrode layer, 902, includes one of metals, metal alloys, conductive metal oxides, conductive metal nitrides, conductive metal silicides, conductive metal carbides, etc. For this example, first electrode layer, 902, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

Lightly- or non-doped zirconium oxide first dielectric layer, 906, is then formed above the first electrode layer, 902. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent thermal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD. As illustrated in the band diagram, it is assumed that first electrode layer, 902, is biased negative relative to second electrode layer, 914.

High band gap second dielectric layer, 920, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes silicon oxide. The high band gap second dielectric layer is typically formed using ALD, PE-ALD, PECVD, or CVD. The high band gap second dielectric layer may have a thickness between 0.5 Å and 10 Å. In this example, the high band gap second dielectric material is silicon oxide. The high band gap of the silicon oxide (~9 eV) versus the lower band gap of zirconium oxide (~5.8 eV) introduces a large energy barrier that the electrons must overcome in order to reach the second electrode layer.

Highly-doped zirconium oxide third dielectric layer, 922, is then formed above the high band gap second dielectric layer, 920. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent anneal step. This highly-doped zirconium oxide third dielectric layer will contribute a high barrier to block conduction through the multi-layer dielectric stack. The highly-doped zirconium oxide third dielectric layer may be formed as a nanolaminate of zirconium oxide layers and dopant oxide layers. The ratio of the number of layers can be varied to determine the concentration of the dopant within the zirconium oxide. In some embodiments, silicon oxide is used as the dopant oxide to form a nanolaminate of zirconium oxide and silicon oxide. The multi-layer dielectric stack may optionally receive a PDA treatment as discussed previously. The highly-doped zirconium oxide third dielectric layer is typically formed using ALD, PE-ALD, PECVD, or CVD. The high band gap of the silicon oxide (~9 eV) versus the lower band gap of zirconium oxide (~5.8 eV) introduces additional large energy barriers that the electrons must overcome in order to reach the second electrode layer. The additional energy barriers are illustrates as separate layers, but those skilled in the art will understand that the silicon oxide is likely uniformly distributed throughout the layer.

In this exemplary capacitor stack, the lightly- or non-doped dielectric material has been described as being formed above the first electrode layer, the high band gap material has been described as being formed above the lightly- or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly- or non-doped material is formed above the high band gap material. Both sequences fall within the scope of the present invention.

In this exemplary capacitor stack, the lightly- or non-doped dielectric material has been described as being the same material as the highly doped material. Those skilled in the art will understand that the two layers may comprise different materials and still achieve the benefits of the present invention. One of the layers (i.e. the lightly- or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly- or non-doped dielectric material. One of the layers (i.e. the lightly- or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Second electrode layer, 914, is formed above the highly-doped zirconium oxide third dielectric layer. Second electrode layer, 914, includes one of metals, metal alloys, conductive metal oxides, conductive metal nitrides, conductive metal silicides, conductive metal carbides, etc. For this example, second electrode layer, 914, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

Figure 10:
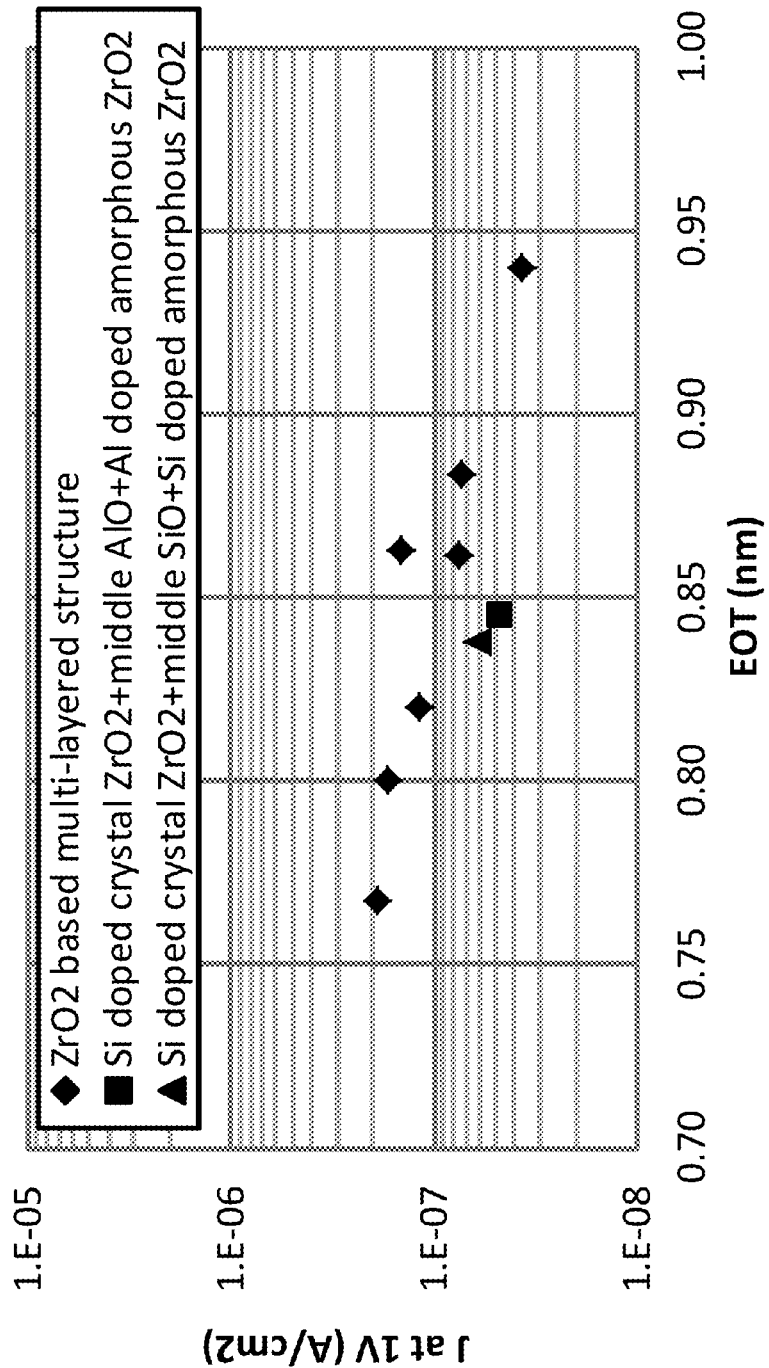
FIG. 10 presents data for J versus EOT in accordance with some embodiments.

FIG. 10 presents data for J versus EOT in accordance with some embodiments. As indicated in Eqn. 2, the EOT can be calculated from the measured capacitance, device area, and the film thickness (d). The data generally correspond to capacitor stacks as discussed with respect to FIGS. 8A and 8B. All of the capacitor stacks used titanium nitride first and second electrodes. The baseline data (illustrated with diamonds) correspond to a capacitor stack (from bottom to top) that includes a titanium oxide flash layer of 1 Å, an undoped zirconium oxide layer of 40 to 55 Å, an aluminum oxide high band gap layer of 1 Å, a highly doped (e.g. doped with 15-20 atomic % Al) zirconium oxide layer of 15 Å, and a titanium oxide capping layer of 5 Å.

The data with a high band gap layer of silicon oxide of 1 Å formed within the undoped zirconium oxide layer (illustrated with squares) correspond to a capacitor stack (from bottom to top) that includes a titanium oxide flash layer of 1 Å, an undoped zirconium oxide layer (including the high band gap layer of silicon oxide) of 45 Å, an aluminum oxide high band gap layer of 1 Å, a highly doped (e.g. doped with 7-20 atomic % Al) zirconium oxide layer of 15 Å, and a titanium oxide capping layer of 5 Å.

The data with a high band gap layer of silicon oxide of 1 Å formed within the undoped zirconium oxide layer (illustrated with triangles) correspond to a capacitor stack (from bottom to top) that includes a titanium oxide flash layer of 1 Å, an undoped zirconium oxide layer (including the high band gap layer of silicon oxide) of 50 Å, an silicon oxide high band gap layer of 1 Å, a highly doped (e.g. doped with 7-20 atomic % Si) zirconium oxide layer of 15 Å, and a titanium oxide capping layer of 5 Å.

The data in FIG. 10 indicate that the addition of silicon (e.g. in the form of silicon dioxide) to zirconium oxide improves the leakage current performance when compared to undoped zirconium oxide at similar values of EOT.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing.

Figure 11:
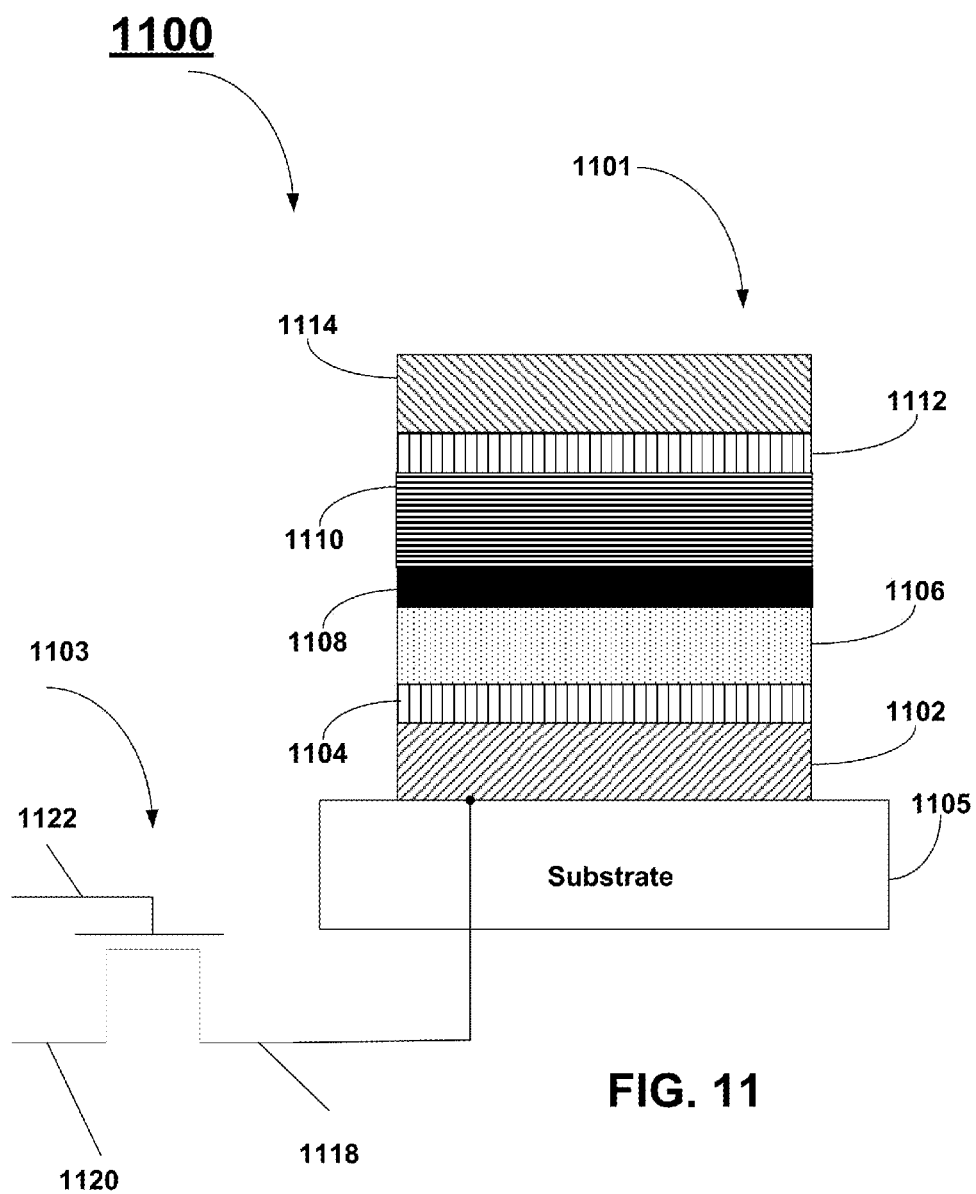
FIG. 11 illustrates a simplified cross-sectional view of a DRAM memory cell fabricated in accordance with some embodiments.

FIG. 11 is used to illustrate one DRAM cell, 1100, manufactured using a structure as discussed previously in reference to FIG. 5A. The cell, 1100, is illustrated schematically to include two principle components: a cell capacitor, 1101, and a cell transistor, 1103. The cell transistor is usually constituted by a MOS transistor having a gate, 1122, source, 1118, and drain, 1120. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 11 illustrates a simplified cross-sectional view of a DRAM capacitor stack fabricated in accordance with some embodiments of the present invention. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

As was described previously, the cell capacitor, 1101, comprises a first electrode layer, 1102, formed above substrate, 1105. The first electrode layer, 1102, is connected to the source or drain of the cell transistor, 1103. For illustrative purposes, the first electrode has been connected to the source, 1118, in this example. First electrode layer, 1102, is formed above substrate, 1105. Generally, the substrate has already received several processing steps in the manufacture of a full DRAM device. First electrode layer, 1102, comprises one of metals, metal alloys, conductive metal oxides, conductive metal nitrides, conductive metal silicides, conductive metal carbides, etc. For this example, first electrode layer, 1102, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 1104, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 1106, is then formed above the flash layer, 1104. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent thermal step. This lightly- or non-doped zirconium oxide first dielectric layer will crystallize during a subsequent anneal treatment and will contribute a high k value to the multi-layer dielectric stack. The lightly- or non-doped zirconium oxide first dielectric layer is typically formed using ALD, PE-ALD, PECVD, or CVD.

High band gap second dielectric layer, 1108, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes aluminum oxide or silicon oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 1110, is then formed above the high band gap second dielectric layer, 1108. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent anneal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 1112, is then formed above the highly-doped zirconium oxide third dielectric layer. In some embodiments, the capping layer includes a dielectric layer. The capping layer is operable to reduce the leakage current through the capacitor stack. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 1114, is formed above the capping layer. Second electrode layer, 1114, includes one of metals, metal alloys, conductive metal oxides, conductive metal nitrides, conductive metal silicides, conductive metal carbides, etc. For this example, second electrode layer, 1114, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

Figure 12:
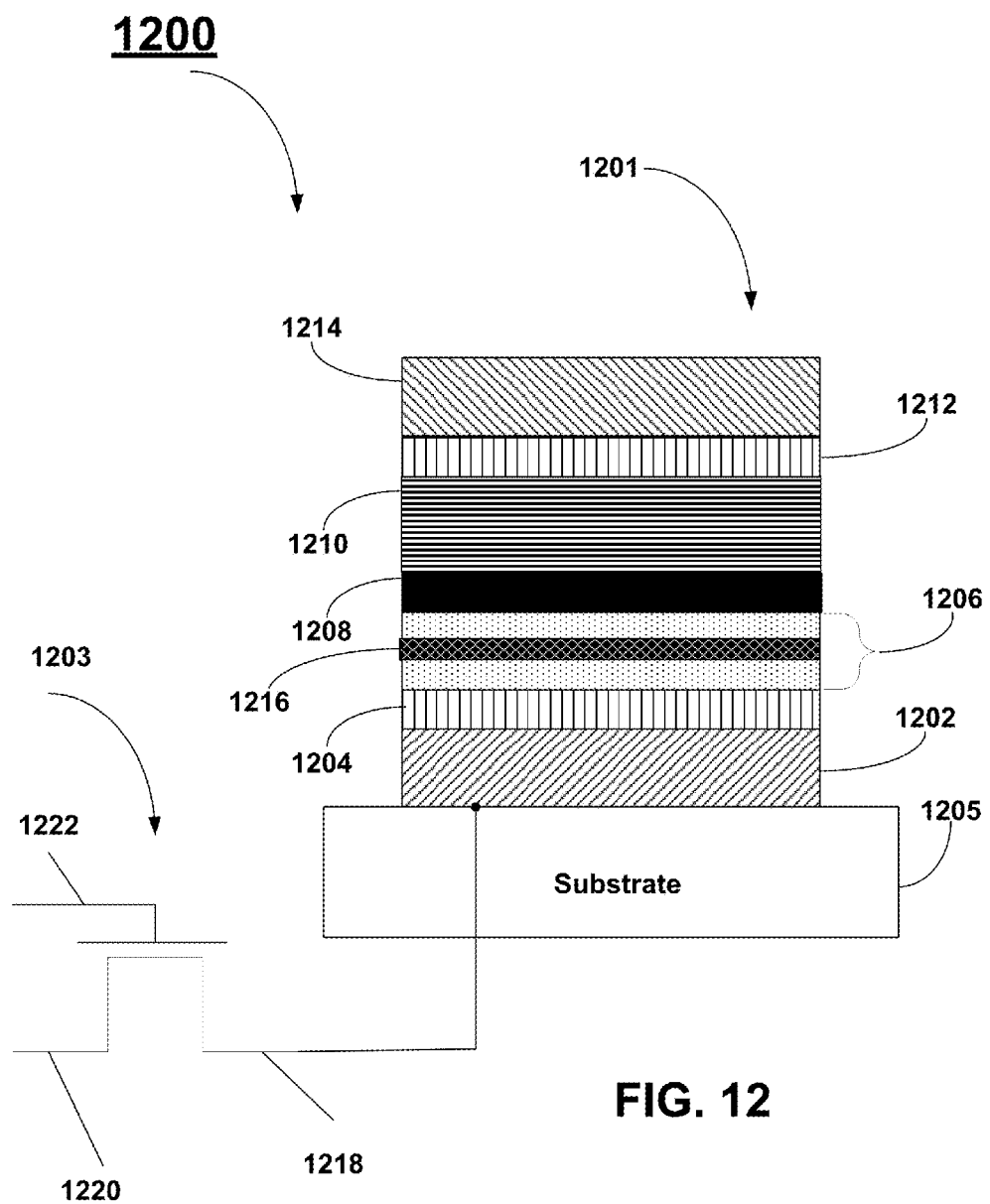
FIG. 12 illustrates a simplified cross-sectional view of a DRAM memory cell fabricated in accordance with some embodiments.

FIG. 12 is used to illustrate one DRAM cell, 1200, manufactured using a structure as discussed previously in reference to FIG. 5B. The cell, 1200, is illustrated schematically to include two principle components: a cell capacitor, 1201, and a cell transistor, 1203. The cell transistor is usually constituted by a MOS transistor having a gate, 1222, source, 1218, and drain, 1220. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 12 illustrates a simplified cross-sectional view of a DRAM capacitor stack fabricated in accordance with some embodiments of the present invention. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

As was described previously, the cell capacitor, 1201, comprises a first electrode layer, 1202, formed above substrate, 1205. The first electrode layer, 1202, is connected to the source or drain of the cell transistor, 1203. For illustrative purposes, the first electrode has been connected to the source, 1218, in this example. First electrode layer, 1202, is formed above substrate, 1205. Generally, the substrate has already received several processing steps in the manufacture of a full DRAM device. First electrode layer, 1202, comprises one of metals, metal alloys, conductive metal oxides, conductive metal nitrides, conductive metal silicides, conductive metal carbides, etc. For this example, first electrode layer, 1202, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 1204, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 1206, is then formed above the flash layer, 1204. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent anneal treatment and will contribute a high k value to the multi-layer dielectric stack. The lightly- or non-doped zirconium oxide first dielectric layer is typically formed using ALD, PE-ALD, PECVD, or CVD.

During the formation of the lightly- or non-doped zirconium oxide first dielectric layer, 1206, a high band gap fourth dielectric layer, 1216, is inserted within the lightly- or non-doped zirconium oxide first dielectric layer. This is accomplished by interrupting the formation of the lightly- or non-doped first dielectric layer process and forming the high band gap fourth dielectric layer, 1216. This layer will remain amorphous during a subsequent anneal treatment because it is thin and will contribute a high barrier to block conduction through the multi-layer dielectric stack. The high band gap fourth dielectric layer is typically formed using ALD, PE-ALD, PECVD, or CVD. The forming of the lightly- or non-doped first dielectric layer, 1206, is then continued to completion. In some embodiments, the high band gap fourth dielectric layer includes one of aluminum oxide or silicon oxide. The high band gap fourth dielectric layer may have a thickness between 1 Å and 10 Å.

High band gap second dielectric layer, 1208, is then formed above the lightly- or non-doped zirconium oxide first dielectric layer. Suitable high band gap second dielectric materials comprise at least one of aluminum oxide, erbium oxide, gadolinium oxide, lanthanum oxide, silicon oxide, or combinations thereof. This layer will remain amorphous during a subsequent anneal treatment because it is thin and will contribute a high barrier to block conduction through the multi-layer dielectric stack. In some embodiments, the high band gap second dielectric layer includes aluminum oxide or silicon oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 1210, is then formed above the high band gap second dielectric layer, 1208. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent thermal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 1212, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 1214, is formed above the capping layer. Second electrode layer, 1214, includes one of metals, metal alloys, conductive metal oxides, conductive metal nitrides, conductive metal silicides, conductive metal carbides, etc. For this example, second electrode layer, 1214, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

Figure 13:
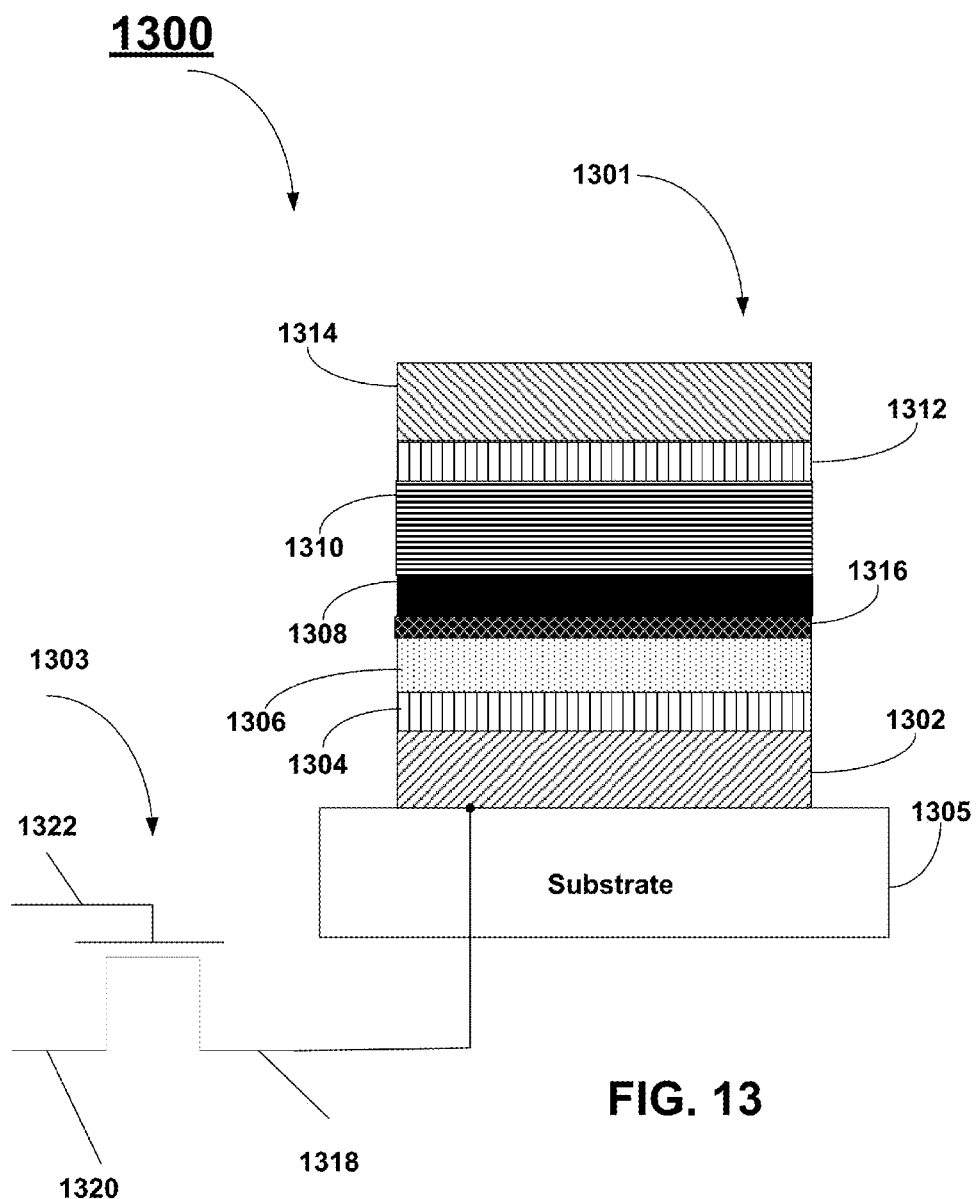
FIG. 13 illustrates a simplified cross-sectional view of a DRAM memory cell fabricated in accordance with some embodiments.

FIG. 13 is used to illustrate one DRAM cell, 1300, manufactured using a structure as discussed previously in reference to FIG. 5C. The cell, 1300, is illustrated schematically to include two principal components: a cell capacitor, 1301, and a cell transistor, 1303. The cell transistor is usually constituted by a MOS transistor having a gate, 1322, source, 1318, and drain, 1320. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 13 illustrates a simplified cross-sectional view of a DRAM capacitor stack fabricated in accordance with some embodiments of the present invention. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

As was described previously, the cell capacitor, 1301, comprises a first electrode layer, 1302, formed above substrate, 1305. The first electrode layer, 1302, is connected to the source or drain of the cell transistor, 1303. For illustrative purposes, the first electrode has been connected to the source, 1318, in this example. First electrode layer, 1302, is formed above substrate, 1305. Generally, the substrate has already received several processing steps in the manufacture of a full DRAM device. First electrode layer, 1302, comprises one of metals, metal alloys, conductive metal oxides, conductive metal nitrides, conductive metal silicides, conductive metal carbides, etc. For this example, first electrode layer, 1302, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

A flash layer, 1304, is formed above the titanium nitride first electrode layer. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 1306, is then formed above the flash layer, 1304. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD.

High band gap fourth dielectric layer, 1316, is then formed above the lightly- or non-doped zirconium oxide first dielectric layer, 1306. This layer will remain amorphous during a subsequent anneal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 0.5 Å and 10 Å. The High band gap fourth dielectric layer is typically formed using ALD, PE-ALD, PECVD, or CVD.

High band gap second dielectric layer, 1308, is then formed above the high band gap fourth dielectric layer, 1316. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes aluminum oxide or silicon. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 1310, is then formed above the high band gap second dielectric layer, 1308. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent thermal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 1312, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 1314, is formed above the capping layer. Second electrode layer, 1314, includes one of metals, metal alloys, conductive metal oxides, conductive metal nitrides, conductive metal silicides, conductive metal carbides, etc. For this example, second electrode layer, 1314, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

Figure 14:
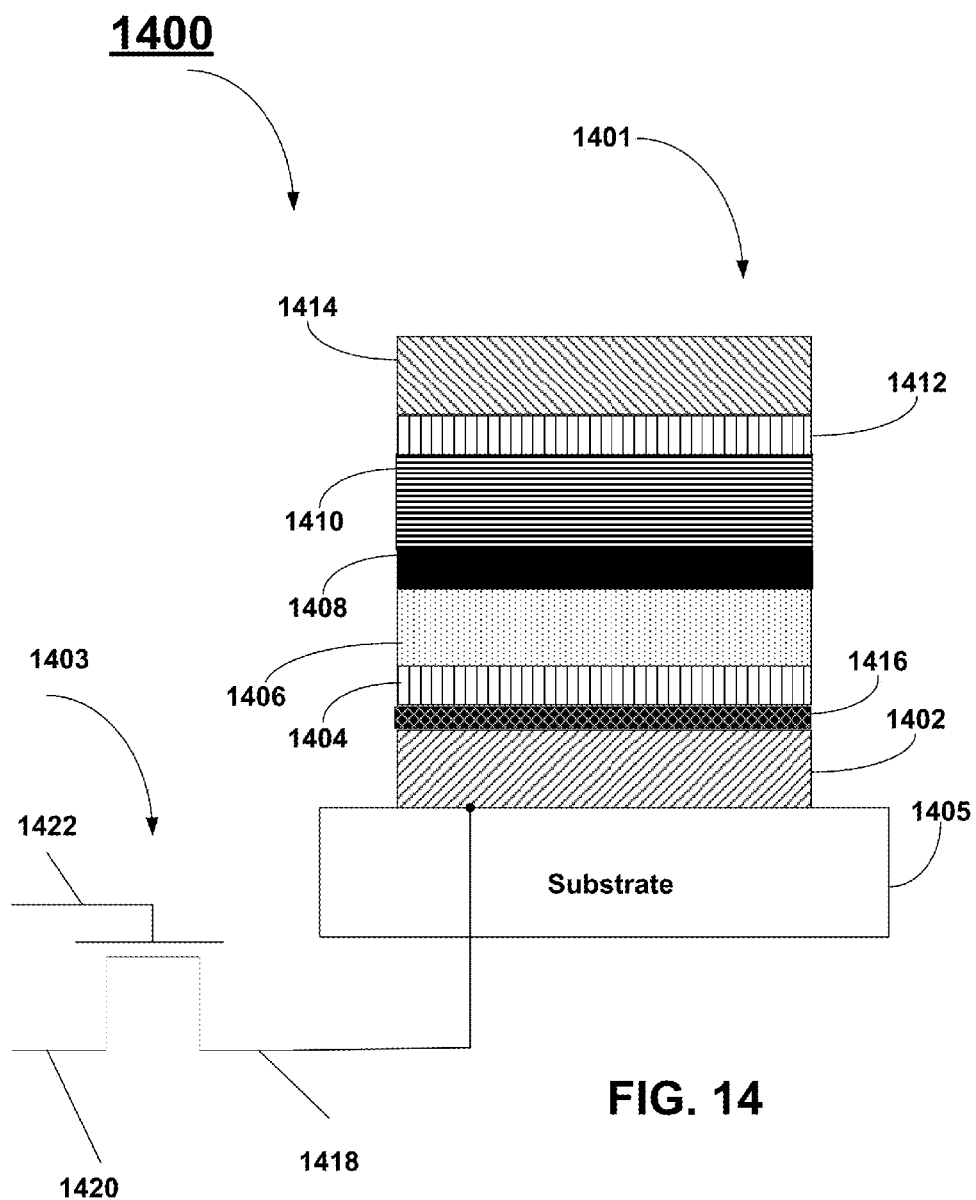
FIG. 14 illustrates a simplified cross-sectional view of a DRAM memory cell fabricated in accordance with some embodiments.

FIG. 14 is used to illustrate one DRAM cell, 1400, manufactured using a structure as discussed previously in reference to FIG. 5D. The cell, 1400, is illustrated schematically to include two principle components, a cell capacitor, 1401, and a cell transistor, 1403. The cell transistor is usually constituted by a MOS transistor having a gate, 1422, source, 1418, and drain, 1420. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 14 illustrates a simplified cross-sectional view of a DRAM capacitor stack fabricated in accordance with some embodiments of the present invention. This example will use zirconium oxide as the dielectric material. However, those skilled in the art will understand that the present methods may be applied to many dielectric materials. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material includes zirconium oxide.

As was described previously, the cell capacitor, 1401, comprises a first electrode layer, 1402, formed above substrate, 1405. The first electrode layer, 1402, is connected to the source or drain of the cell transistor, 1403. For illustrative purposes, the first electrode has been connected to the source, 1418, in this example. First electrode layer, 1402, is formed above substrate, 1405. Generally, the substrate has already received several processing steps in the manufacture of a full DRAM device. First electrode layer, 1402, comprises one of metals, metal alloys, conductive metal oxides, conductive metal nitrides, conductive metal silicides, conductive metal carbides, etc. For this example, first electrode layer, 1402, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The titanium nitride first electrode layer may optionally receive an RTA anneal treatment before the formation of the multi-layer dielectric material as discussed previously.

High band gap fourth dielectric layer, 1416, is then formed above the first electrode layer, 1402. This layer will remain amorphous during a subsequent anneal treatment because it is thin and will contribute a high barrier to block conduction through the multi-layer dielectric stack. In some embodiments, the high band gap fourth dielectric layer includes one of aluminum oxide or silicon oxide. The high band gap fourth dielectric layer may have a thickness between 0.5 Å and 10 Å.

The High band gap fourth dielectric layer is typically formed using ALD, PE-ALD, PECVD, or CVD.

A flash layer, 1404, is formed above the high band gap fourth dielectric layer, 1416. Examples of suitable dielectric materials for use as flash layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the flash layer includes titanium oxide. The flash layer may have a thickness between 1 Å and 10 Å.

Lightly- or non-doped zirconium oxide first dielectric layer, 1406, is then formed above the flash layer, 1404. Suitable dopants for use with zirconium oxide dielectric materials comprise aluminum, cerium, cobalt, erbium, gallium, gadolinium, germanium, hafnium, lanthanum, magnesium, molybdenum, niobium, silicon, tin, strontium, titanium, vanadium, yttrium, or combinations thereof. The doping level is maintained at levels below about 10 atomic % and advantageously below about 7 atomic % so that the lightly- or non-doped zirconium oxide first dielectric layer will crystallize during a subsequent anneal step. This lightly- or non-doped zirconium oxide first dielectric layer will crystallize during a subsequent thermal treatment and will contribute a high k value to the multi-layer dielectric stack. The lightly- or non-doped zirconium oxide first dielectric layer is typically formed using ALD, PE-ALD, PECVD, or CVD.

High band gap second dielectric layer, 1408, is then formed above the lightly- or non-doped zirconium oxide first dielectric layer, 1406. Suitable high band gap second dielectric materials comprise at least one of aluminum oxide, erbium oxide, gadolinium oxide, lanthanum oxide, silicon oxide, or combinations thereof. This layer will remain amorphous during a subsequent thermal treatment because it is thin and will contribute a high barrier to block conduction through the multi-layer dielectric stack. In some embodiments, the high band gap second dielectric layer includes aluminum oxide or silicon oxide. The high band gap second dielectric layer is typically formed using ALD, PE-ALD, PECVD, or CVD. The high band gap second dielectric layer may have a thickness between 1 Å and 10 Å.

Highly-doped zirconium oxide third dielectric layer, 1410, is then formed above the high band gap second dielectric layer, 1408. Suitable dopants for use with zirconium oxide dielectric materials comprise aluminum, cobalt, erbium, gallium, gadolinium, germanium, hafnium, lanthanum, magnesium, silicon, tin, strontium, titanium, yttrium, or combinations thereof. The doping level is maintained at levels above about 7 atomic % and advantageously above about 20 atomic % so that the layer will not crystallize during a subsequent thermal step. This highly-doped zirconium oxide third dielectric layer will contribute a high barrier to block conduction through the multi-layer dielectric stack. The multi-layer dielectric stack may optionally receive a PDA treatment as discussed previously. The highly-doped zirconium oxide third dielectric layer is typically formed using ALD, PE-ALD, PECVD, or CVD.

Capping layer, 1412, is then formed above the Highly-doped zirconium oxide third dielectric layer. In some embodiments, the capping layer includes a dielectric layer. The use of capping layers within DRAM devices was described in reference to FIG. 4A. Examples of suitable dielectric materials for use as capping layers include cerium oxide, erbium oxide, gallium oxide, gadolinium oxide, lanthanum oxide, molybdenum oxide, niobium oxide, titanium oxide, vanadium oxide, and zirconium oxide. In some embodiments, the capping layer includes titanium oxide. The capping layer may have a thickness between 1 Å and 10 Å.

Second electrode layer, 1414, is formed above the capping layer. Second electrode layer, 1414, includes one of metals, metal alloys, conductive metal oxides, conductive metal nitrides, conductive metal silicides, conductive metal carbides, etc. For this example, second electrode layer, 1414, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when zirconium oxide is used as the dielectric material. The titanium nitride is typically formed using PVD, PECVD, CVD, or ALD. The capacitor stack may then receive an anneal treatment (e.g. a PMA treatment) as discussed previously.

In these exemplary DRAM cells, the lightly- or non-doped dielectric material has been described as being formed above the first electrode layer, the high band gap material has been described as being formed above the lightly- or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly- or non-doped material is formed above the high band gap material. Both sequences fall within the scope of the present invention.

In these exemplary DRAM cells, the lightly- or non-doped dielectric material has been described as being the same material as the highly doped material. Those skilled in the art will understand that the two layers may comprise different materials and still achieve the benefits of the present invention. One of the layers (i.e. the lightly- or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly- or non-doped dielectric material. One of the layers (i.e. the lightly- or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack comprising:
   forming a flash layer above a first electrode layer;
   forming a first dielectric layer above the flash layer, wherein the first dielectric layer comprises metal oxide, wherein the first dielectric layer comprises a dopant, and wherein the dopant comprises silicon;
   inserting a high band gap fourth dielectric layer within the first dielectric layer during the forming of the first dielectric layer;

forming a high band gap second dielectric layer above the first dielectric layer;

forming a third dielectric layer above the high band gap second dielectric layer, wherein the third dielectric layer comprises metal oxide, wherein the third dielectric layer comprises a second dopant, and wherein the second dopant comprises silicon; and forming a capping layer above the third dielectric layer, wherein the flash layer and the capping layer each comprise titanium oxide.

2. The method of claim 1, wherein the metal of the first dielectric layer and the metal of the third dielectric layer each comprises one of aluminum, barium, erbium, hafnium, lanthanum, niobium, lead, strontium, tantalum, titanium or zirconium.

3. The method of claim 2, wherein the metal of the first dielectric layer and the metal of the third dielectric layer each comprises zirconium.

4. The method of claim 1, wherein a concentration of the dopant in the first dielectric layer is less than about 7 atomic %.

5. The method of claim 1, wherein a concentration of the second dopant in the third dielectric layer is between about 7 atomic % and 20 atomic %.

6. The method of claim 1, wherein the high band gap second dielectric layer comprises one of erbium oxide, gadolinium oxide, lanthanum oxide, silicon oxide, aluminum oxide or combinations thereof.

7. The method of claim 1, wherein the high band gap second dielectric layer comprises silicon oxide.

8. The method of claim 1, wherein the thickness of each of the flash layer and the capping layer is less than about 10 Å.

9. The method of claim 1, wherein the high band gap fourth dielectric layer comprises silicon oxide.

10. A method for forming a capacitor stack comprising:
forming a flash layer above a first electrode layer;
forming a first dielectric layer above the flash layer, wherein the first dielectric layer comprises metal oxide, wherein the first dielectric layer comprises a dopant, and wherein the dopant comprises silicon;

forming a high band gap second dielectric layer above the first dielectric layer;

forming a third dielectric layer above the high band gap second dielectric layer, wherein the third dielectric layer comprises metal oxide, wherein the first third dielectric layer comprises a second dopant, and wherein the dopant comprises silicon; and forming a capping layer above the third dielectric layer, wherein the flash and the capping layer each comprise titanium oxide.

11. The method of claim 10, wherein the metal of the first dielectric layer and the metal of the third dielectric layer each comprises one of aluminum, barium, erbium, hafnium, lanthanum, niobium, lead, strontium, tantalum, titanium or zirconium.

12. The method of claim 11, wherein the metal of the first dielectric layer and the metal of the third dielectric layer each comprises zirconium.

13. The method of claim 10, wherein the high band gap second dielectric layer comprises one of erbium oxide, gadolinium oxide, lanthanum oxide, silicon oxide, aluminum oxide or combinations thereof.

14. The method of claim 10, wherein the high band gap second dielectric layer comprises aluminum oxide.

15. The method of claim 10, wherein the thickness of each of the flash layer and the capping layer is less than about 10 Å.

16. The method of claim 10, wherein the high band gap fourth dielectric layer comprises silicon oxide.

* * * * *